(12) United States Patent
Yamanaka

(10) Patent No.: US 7,749,678 B2
(45) Date of Patent: Jul. 6, 2010

(54) PHOTOSENSITIVE COMPOSITION AND PATTERN FORMING METHOD USING THE SAME

(75) Inventor: Tsukasa Yamanaka, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 20 days.

(21) Appl. No.: 11/085,482

(22) Filed: Mar. 22, 2005

(65) Prior Publication Data

US 2005/0233242 A1 Oct. 20, 2005

(30) Foreign Application Priority Data

Mar. 22, 2004 (JP) .............................. 2004-082679

(51) Int. Cl.
  *G03F 7/00* (2006.01)
  *G03F 7/004* (2006.01)
(52) U.S. Cl. .................... 430/270.1; 430/330; 430/331; 430/905; 430/913
(58) Field of Classification Search ........................ None
  See application file for complete search history.

(56) References Cited

U.S. PATENT DOCUMENTS

| | | | | |
|---|---|---|---|---|
| 5,558,976 | A * | 9/1996 | Urano et al. ................. | 430/326 |
| 5,683,851 | A * | 11/1997 | Tan et al. ..................... | 430/191 |
| 6,200,728 | B1 * | 3/2001 | Cameron et al. .......... | 430/270.1 |
| 6,203,965 | B1 * | 3/2001 | Cameron et al. .......... | 430/270.1 |
| 6,280,911 | B1 * | 8/2001 | Trefonas, III ................ | 430/326 |
| 6,432,608 | B1 | 8/2002 | Fujie et al. | |
| 6,720,460 | B2 * | 4/2004 | Yoshikawa et al. .......... | 568/719 |
| 6,740,467 | B2 * | 5/2004 | Trefonas, III ............ | 430/270.1 |
| 6,803,169 | B2 * | 10/2004 | Cameron et al. .......... | 430/270.1 |
| 6,818,379 | B2 * | 11/2004 | Kamabuchi et al. ...... | 430/270.1 |
| 6,846,609 | B2 | 1/2005 | Uetani et al. | |
| 7,005,228 | B2 * | 2/2006 | Hatakeyama et al. .... | 430/270.1 |
| 7,232,638 | B2 * | 6/2007 | Hatakeyama et al. .... | 430/270.1 |
| 2002/0012866 | A1 * | 1/2002 | Nishiyama et al. .......... | 430/170 |
| 2003/0039920 | A1 | 2/2003 | Fujie et al. | |
| 2003/0075708 | A1 | 4/2003 | Kodama | |
| 2006/0210916 | A1 | 9/2006 | Yamazaki et al. | |

FOREIGN PATENT DOCUMENTS

| | | | |
|---|---|---|---|
| EP | 709736 | A1 * | 5/1996 |
| EP | 1053986 | A1 * | 11/2000 |
| EP | 1260864 | A1 * | 11/2002 |
| EP | 1338921 | A2 * | 8/2003 |
| EP | 1491951 | A2 * | 12/2004 |
| JP | 7-181680 | A | 7/1995 |
| JP | 2000-241979 | A | 9/2000 |
| JP | 2001-151824 | A | 6/2001 |
| JP | 2002-207294 | A | 7/2002 |
| JP | 2003-35948 | A | 2/2003 |
| JP | 2003-43677 | A | 2/2003 |
| JP | 2003-322963 | A | 11/2003 |
| JP | 2005-91863 | A | 4/2005 |
| JP | 2005-122097 | A | 5/2005 |

\* cited by examiner

*Primary Examiner*—Amanda C. Walke
(74) *Attorney, Agent, or Firm*—Sughrue Mion, PLLC

(57) ABSTRACT

A photosensitive composition comprising (A) a resin that is decomposed by the action of an acid to increase solubility in an alkali developing solution, (B) a compound that generates an acid upon irradiation of an actinic ray or radiation, and (C1) a compound having a molecular weight of 1,000 or less and containing an aliphatic ring and an aromatic ring, and a photosensitive composition comprising (A) a resin that is decomposed by the action of an acid to increase solubility in an alkali developing solution, (B) a compound that generates an acid upon irradiation of an actinic ray or radiation, and (C2) a resin containing a hydroxystyrene unit; and a pattern forming method using these photosensitive composition.

10 Claims, No Drawings

PHOTOSENSITIVE COMPOSITION AND PATTERN FORMING METHOD USING THE SAME

FIELD OF THE INVENTION

The present invention relates to a photosensitive composition used in the production process of semiconductor devices, for example, IC, in the production of circuit substrates for liquid crystals or thermal heads and in other photofabrication processes. More specifically, the invention relates to a photosensitive composition suitable for using a far ultraviolet ray of 250 nm or less as a light source for exposure or an electron beam as an irradiation source.

BACKGROUND OF THE INVENTION

It is a well known technique to add a phenolic compound to a chemically amplified resist as described in Patent Document 1 (JP-A-7-181680 (the term "JP-A" as used herein means an "unexamined published Japanese patent application")). However, the technique is regarded as subsidiary means for dissolving a resist film in a developing solution. Transmittance of the phenolic compound at 193 nm is low, and thus it is ordinarily not preferred to add the phenolic compound to a resist for an ArF eximer laser (193 nm) because transparency of the resist is remarkably reduced.

In Patent Document 2 (JP-A-2000-241979), a technique of adding a polyhydric phenol to an ArF resist is described. However, since the polyhydric phenol is ordinarily apt to be oxidized, it is insufficient in view of preservation stability. Further, in Patent Document 3 (JP-A-2003-322963), a technique of adding a phenolic compound to an alicyclic resin is described. In the patent document, it is suggested that functions of the phenolic compound are increase in an acid generating efficiency of a photo-acid generator and profile control due to absorption. However, in a thin film having a resist thickness of 250 nm or less, the phenolic compound specifically described therein is insufficient in view of improvements in the profile control and line edge roughness.

With miniaturization of resist pattern, the resist thickness tends to decrease 250 nm or less. However, when the resist thickness is simply decreased, pattern collapse and degradations of profile, line edge roughness, exposure latitude (tolerance of variation in an exposure amount at the exposure), focus latitude (tolerance of misalignment of focus at the exposure), or the like are observed. Thus, a resist adapting to a thickness of 250 nm or less has been desired.

Patent Document 1: JP-A-7-181680
Patent Document 2: JP-A-2000-241979
Patent Document 3: JP-A-2003-322963

SUMMARY OF THE INVENTION

Therefore, an object of the invention is to provide a photosensitive composition that adapts to a thickness of 250 nm or less suitable for exposure with an exposure wavelength of 200 nm or less, particularly, exposure with an ArF excimer laser, and is excellent in pattern profile as well as in sensitivity and resolution, of less pattern collapse and improved in line edge roughness, exposure latitude and focus latitude, and a pattern forming method using the same.

As a result of the intensive investigations for achieving the objects of the invention, the inventor has found that addition of a specific compound, that is, (C1) a compound having a molecular weight of 1,000 or less and containing an aliphatic ring and an aromatic ring or (C2) a resin containing a hydroxystyrene unit to a photosensitive composition containing (A) a resin that is decomposed by the action of an acid to increase solubility in an alkali developing solution and (B) a compound that generates an acid upon irradiation of an actinic ray or radiation is effective to complete the invention.

More specifically, the invention includes the following constitutions.

(1) A photosensitive composition comprising (A) a resin that is decomposed by the action of an acid to increase solubility in an alkali developing solution, (B) a compound that generates an acid upon irradiation of an actinic ray or radiation, and (C1) a compound having a molecular weight of 1,000 or less and containing an aliphatic ring and an aromatic ring.

(2) The photosensitive composition as described in item (1) above, wherein the compound (C1) having a molecular weight of 1,000 or less and containing an aliphatic ring and an aromatic ring is a compound containing an aliphatic ring and a phenol ring.

(3) A photosensitive composition comprising (A) a resin that is decomposed by the action of an acid to increase solubility in an alkali developing solution, (B) a compound that generates an acid upon irradiation of an actinic ray or radiation, and (C2) a resin containing a hydroxystyrene unit.

(4) The photosensitive composition as described in item (3) above, wherein the resin (C2) has a molecular weight distribution of 2.0 or less.

(5) The photosensitive composition as described in item (3) or (4) above, wherein the resin (C2) is a resin wherein a part of hydroxy groups of polyhydroxystyrene are protected with a group decomposable by a reaction with an acid.

(6) The photosensitive composition as claimed in any one of items (3) to (5) above, wherein the resin (C2) is a copolymer containing at least a hydroxystyrene unit and a unit wherein a carboxy group in methacrylic acid or acrylic acid is protected with an alicyclic group decomposable by an acid.

(7) A positive pattern forming method comprising forming a photosensitive layer having a dry layer thickness of 250 nm or less comprising the photosensitive composition as claimed in any one of items (1) to (6) above on a substrate, exposing the photosensitive layer to an actinic ray or radiation having a wavelength of 200 nm or less, subjecting the exposed photosensitive layer to heat treatment at 150° C. or lower, and then developing the heat-treated photosensitive layer with an alkali developing solution.

DETAILED DESCRIPTION OF THE INVENTION

According to the invention, a photosensitive composition (in particular, a resist composition) that is excellent in pattern profile as well as in sensitivity and resolution, of less pattern collapse and improved in line edge roughness, exposure latitude and focus latitude, in addition that achieves transmittance necessary for preventing reflection from a substrate due to reduction of thickness, and a pattern forming method using the same can be provided.

The compounds for use in the invention will be described in detail below.

With respect to the description of a group (atomic group) in the specification, the term "group" which is not referred to whether it is substituted or not means and includes both a group having no substituent and a group having a substituent. For example, an "alkyl group" includes not only an alkyl group having no substituent (an unsubstituted alkyl group) but also an alkyl group having a substituent (a substituted alkyl group).

[1] Resin (A)

Resin (A) contained in the photosensitive composition of the invention is a resin (acid-decomposable resin) that increases solubility in an alkali developing solution by the action of an acid and contains a group (acid-decomposable group) that is decomposed by the action of an acid to generate an alkali-soluble group.

The alkali-soluble group includes, for example, a carboxylic acid group, a hydroxy group, a sulfonic acid group and a thiol group, and a carboxylic acid group and a hydroxy group are preferred.

The acid-decomposable group includes, in addition to a group (acid-decomposable group) wherein an alkali-soluble group is protected with a structure having an alicyclic group represented by any one of formulae (pI) to (pVI), for example, a group represented by a formula of —C(=O)—$X_1$—$R_0$. In the formula, examples of $R_0$ include a tertiary alkyl group, for example, a tert-butyl group or a tert-amyl group, a 1-alkoxyethyl group, for example, an isobornyl group, a 1-ethoxyethyl group, a 1-butyoxyethyl group, a 1-isobutoxyethyl group or a 1-cyclohexyloxyethyl group, an alkoxymethyl group, for example, a 1-methoxymethyl group or a 1-ethoxymethyl group, a 3-oxoalkyl group, a tetrahydropyranyl group, a tetrahydrofuranyl group, a trialkylsilyl ester group, a 3-oxocyclohexyl ester group, a 2-methyl-2-adamantyl group and a mevalonic lactone residue. $X_1$ represents an oxygen atom, a sulfur atom, —NH—, —$NHSO_2$— or —$NHSO_2NH$—.

The resin (A) preferably contains a repeating unit having an alicyclic group, and particularly preferably contains a repeating unit including an acid-decomposable group having an alicyclic group.

Preferred examples of the repeating unit having an alicyclic group include a repeating unit having a partial structure containing an alicyclic group (alicyclic hydrocarbon group) represented by any one of the following formulae (pI) to (pVI):

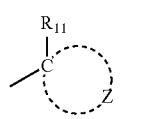
(pI)

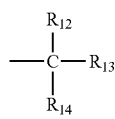
(pII)

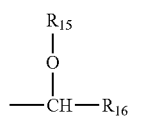
(pIII)

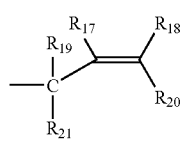
(pIV)

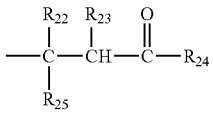
(pV)

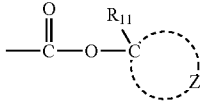
(pVI)

In the above formulae, $R_{11}$ represents a methyl group, an ethyl group, a n-propyl group, an isopropyl group, a n-butyl group, an isobutyl group or a sec-butyl group, and Z represents an atomic group necessary for forming an alicyclic group together with the carbon atom.

$R_{12}$ to $R_{16}$ each independently represents a straight chain or branched alkyl group having from 1 to 4 carbon atoms or an alicyclic group, provided that at least one of $R_{12}$ to $R_{14}$ or either $R_{15}$ or $R_{16}$ represents an alicyclic group.

$R_{17}$ to $R_{21}$ each independently represents a hydrogen atom, a straight chain or branched alkyl group having from 1 to 4 carbon atoms or an alicyclic group, provided that at least one of $R_{17}$ to $R_{21}$ represents an alicyclic group, and either $R_{19}$ or $R_{21}$ represents a straight chain or branched alkyl group having from 1 to 4 carbon atoms or an alicyclic group.

$R_{22}$ to $R_{25}$ each independently represents a hydrogen atom, a straight chain or branched alkyl group having from 1 to 4 carbon atoms or an alicyclic group, provided that at least one of $R_{22}$ to $R_{25}$ represents an alicyclic group. Alternatively, $R_{23}$ and $R_{24}$ may be connected to each other to form a ring.

In formulae (pI) to (pVI), the alkyl group in $R_{12}$ to $R_{25}$ represents a straight chain or branched alkyl group having from 1 to 4 carbon atoms. Examples of the alkyl group include a methyl group, an ethyl group, a n-propyl group, an isopropyl group, a n-butyl group, an isobutyl group, a sec-butyl group and a tert-butyl group.

As a substituent which the alkyl group may have, an alkoxy group (preferably having from 1 to 4 carbon atoms), a halogen atom (for example, a fluorine atom, a chlorine atom, a bromine atom or an iodine atom), an acyl group (preferably having from 2 to 10 carbon atoms), an acyloxy group (preferably having from 2 to 10 carbon atoms), a cyano group, a hydroxy group, a carboxy group, an alkoxycarbonyl group (preferably having from 2 to 6 carbon atoms) and a nitro group are exemplified.

The alicyclic group in $R_{11}$ to $R_{25}$ or the alicyclic group formed by Z and the carbon atom may be a monocyclic or polycyclic group. Specific examples thereof include groups having a monocyclic, bicyclic, tricyclic or tetracyclic structure having 5 or more carbon atoms. The number of carbon atoms included is preferably from 6 to 30, particularly preferably from 7 to 25. The alicyclic group may have a substituent.

Specific examples of moieties constituting a cyclic structure in the alicyclic group are set forth below.

(1)

-continued
(2)
(3)
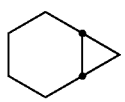
(4)
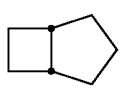
(5)
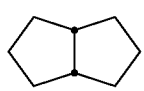
(6)
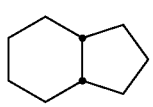
(7)
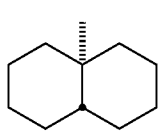
(8)
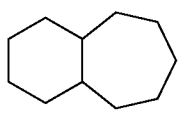
(9)
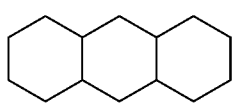
(10)
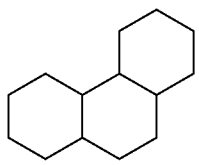
(11)
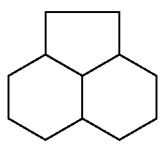
(12)
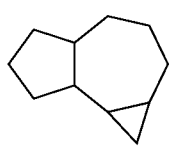
(13)
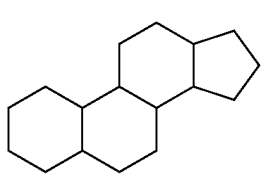
-continued
(14)
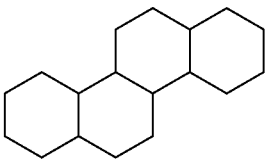
(15)
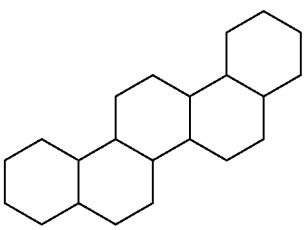
(16)
(17)
(18)
(19)
(20)
(21)
(22)
(23)
(24)
(25)
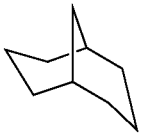

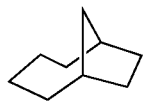
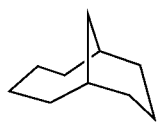
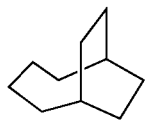
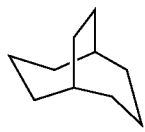
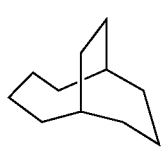
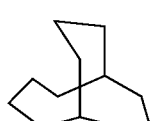
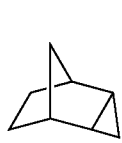
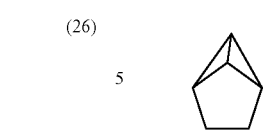
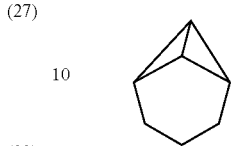
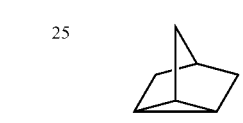
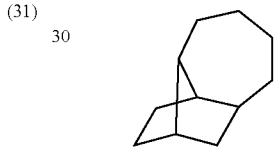
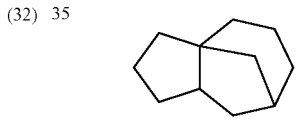
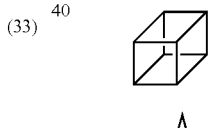
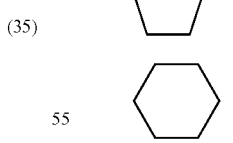
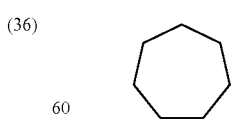
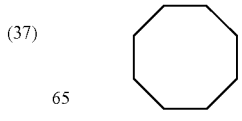

Preferred examples of the above-described alicyclic group include an adamantly group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group and a dyclododecanyl group. More preferred examples thereof include an adamantly group, a decalin residue, a norbornyl group, a cedrol group, a cyclohexyl group, a cycloheptyl group, a cyclooctyl group, a cyclodecanyl group and a cyclododecanyl group.

Examples of the substituent that the alicyclic structure may have include an alkyl group, a halogen atom, a hydroxy group, an alkoxy group, a carboxy group and an alkoxycarbonyl group.

Examples of the alkyl group include a lower alkyl group, for example, a methyl group, an ethyl group, a propyl group, an isopropyl group or a butyl group. More preferred examples thereof include a methyl group, an ethyl group, a propyl group and an isopropyl group.

Examples of the alkoxy group include an alkoxy group having from 1 to 4 carbon atoms, for example, a methoxy group, an ethoxy group, a propoxy group or a butoxy group.

The alkyl group and alkoxy group may further have a substituent, and examples of the substituent include a hydroxy group, a halogen atom and an alkoxy group (preferably having from 1 to 4 carbon atoms).

Preferred examples of the group (acid-decomposable group) wherein an alkali-soluble group is protected with the structure represented by any one of formulae (pI) to (pVI), include groups represented by the following formulae (pVII) to (pXI).

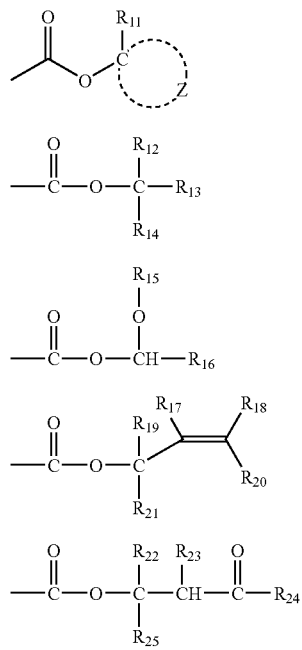

In the above formulae, $R_{11}$ to $R_{25}$ and Z have the same meanings as defined above, respectively.

Examples of the repeating unit having an alkali-soluble group protected with a group containing the alicyclic group represented by any one of formulae (pI) to (pVI) include a repeating unit represented by the following formula (pA).

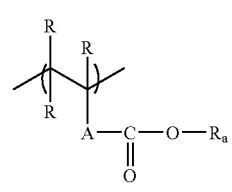

(pA)

In the above formula, R represents a hydrogen atom, a halogen atom or an alkyl group (preferably having from 1 to 4 carbon atoms). A plurality of Rs may be the same different from each other.

A represents an individual group or a combination of two or more groups selected from a single bond, an alkylene group, an ether group, a thioether group, a carbonyl group, an ester group, an amido group, a sulfonamido group, a urethane group and a urea group.

$R_a$ represents any one of the groups represented by formulae (pI) to (pVI) described above.

Specific examples of the monomer corresponding to the repeating unit represented by formula (pA) are set forth below.

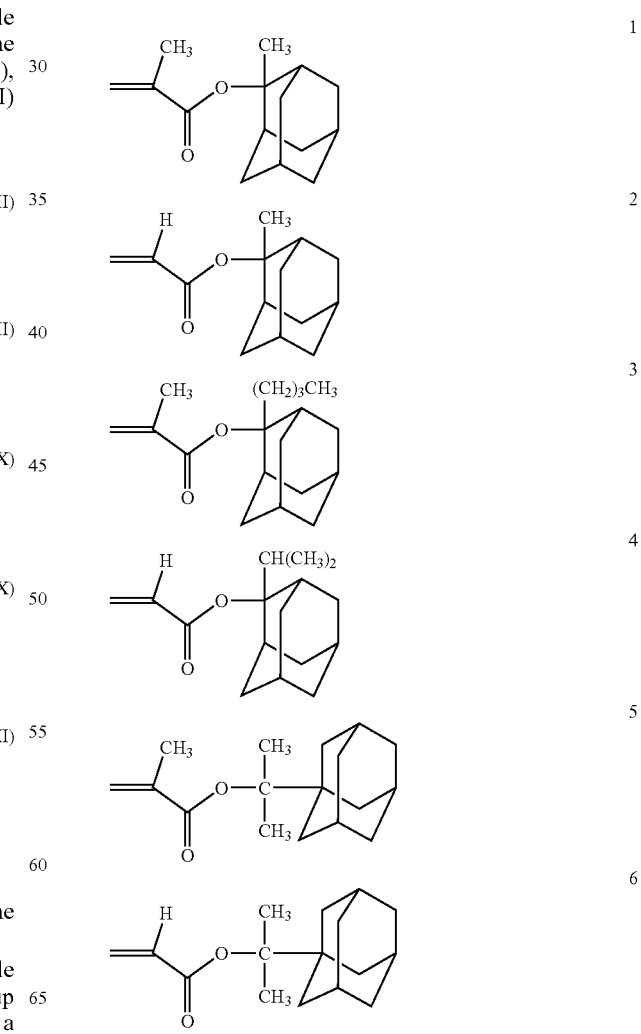

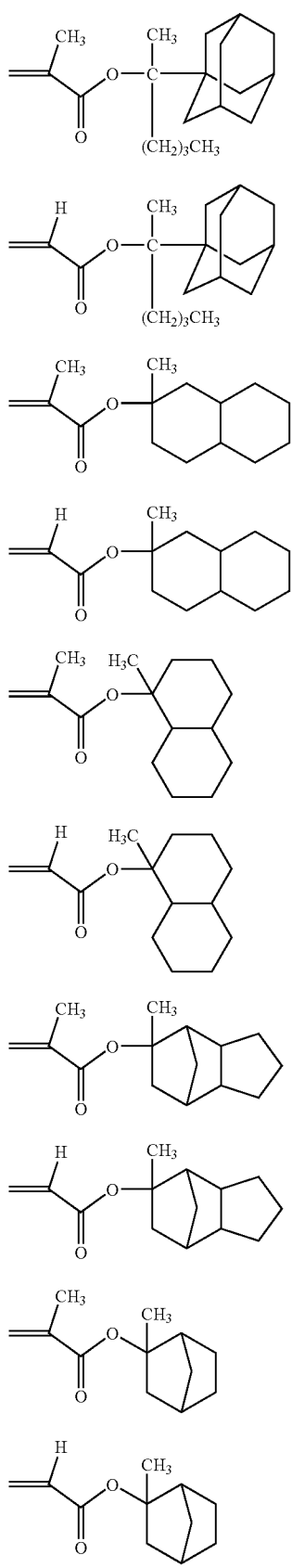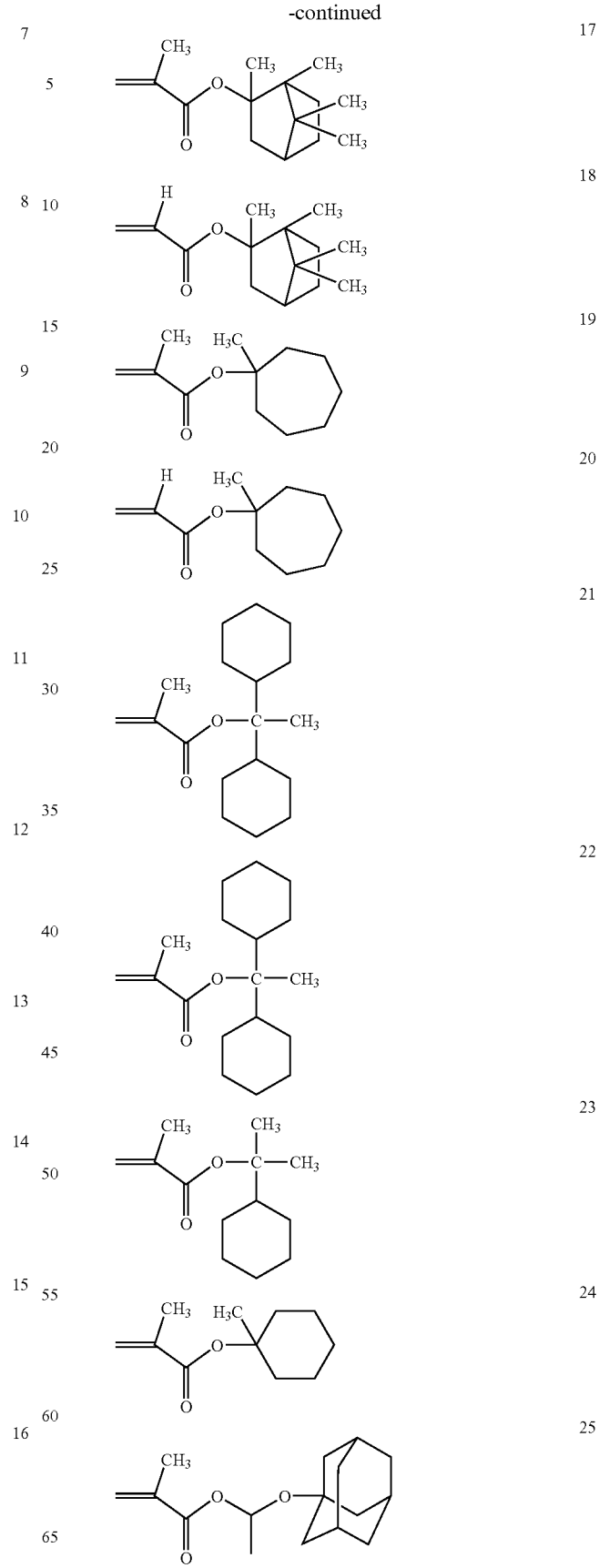

-continued

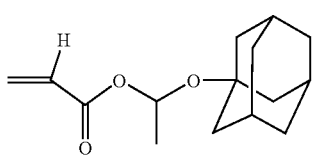
26

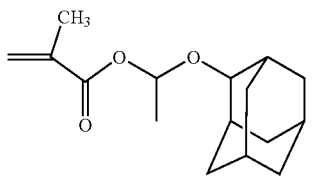
27

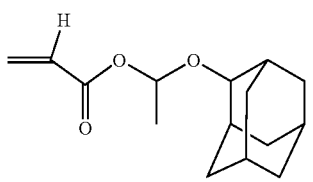
28

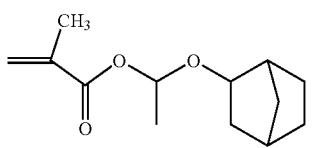
29

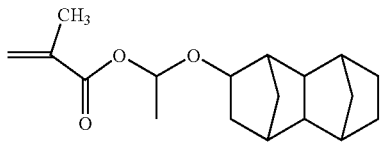
30

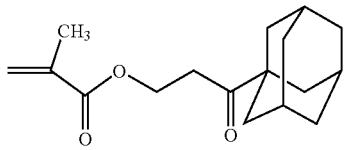
31

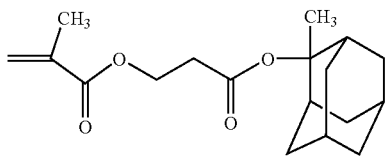
32

The resin (A) preferably contains a repeating unit having a group represented by the following formula (I).

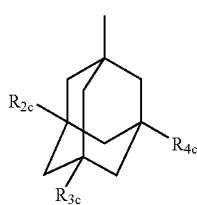
(I)

In formula (I), $R_{2c}$ to $R_{4c}$ each independently represents a hydrogen atom or a hydroxy group, provided that at least one of $R_{2c}$ to $R_{4c}$ represents a hydroxy group.

The group represented by formula (I) is preferably a dihydroxy-substituted group or a monohydroxy-substituted group, and particularly preferably a dihydroxy-substituted group.

Examples of the repeating unit having the group represented by formula (I) include a repeating unit represented by the following formula (AII).

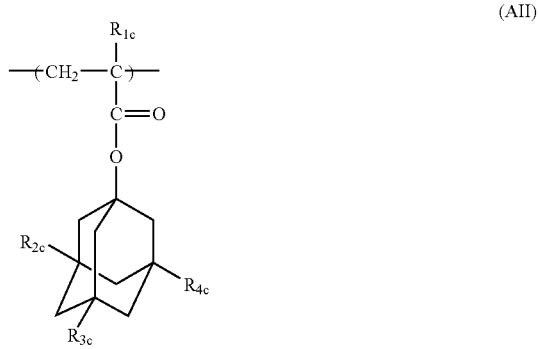
(AII)

In formula (AII), $R_{1c}$ represents a hydrogen atom or a methyl group. $R_{2c}$ to $R_{4c}$ each independently represents a hydrogen atom or a hydroxy group, provided that at least one of $R_{2c}$ to $R_{4c}$ represents a hydroxy group.

Specific examples of the repeating unit having the structure represented by formula (AII) are set forth below, but the invention should not be construed as being limited thereto.

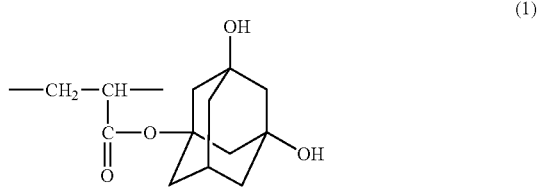
(1)

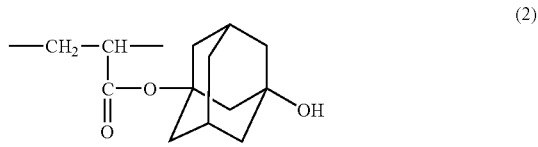
(2)

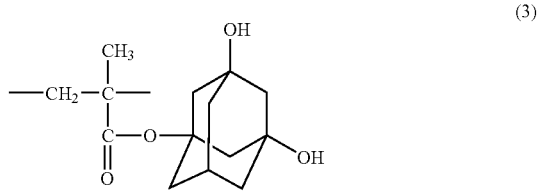
(3)

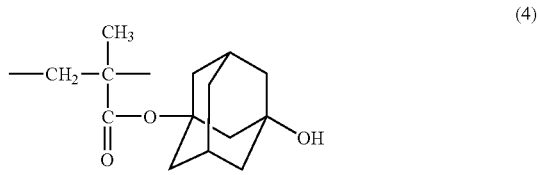
(4)

The resin (A) also preferably contains any one of repeating units represented by the following formulae (A1) and (A2).

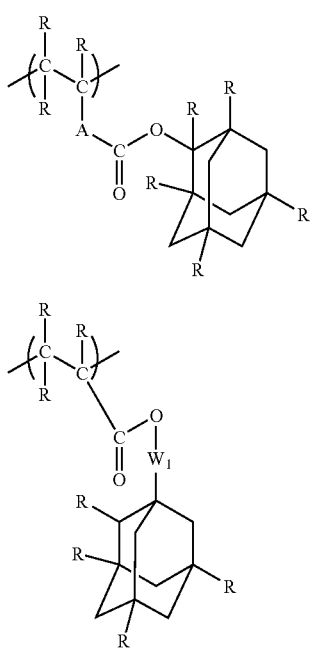

(A1)

(A2)

In the above formulae, R represents a hydrogen atom, a hydroxy group, a halogen atom or an alkyl group having from 1 to 4 carbon atoms (preferably a methyl group or an ethyl group). A plurality of Rs may be the same or different from each other.

A represents an individual group or a combination of two or more groups selected from a single bond, an alkylene group, an ether group, a thioether group, a carbonyl group, an ester group, an amido group, a sulfonamido group, a urethane group and a urea group.

$W_1$ represents an alkylene group.

Examples of the alkylene group represented by A or $W_1$ include groups represented by the following formula:

—[C(Rf)(Rg)]$r_1$—

In the above formula, Rf and Rg, which may be the same or different, each represents a hydrogen atom, an alkyl group, a halogen atom, a hydroxy group or an alkoxy group. Preferred examples of the alkyl group include a lower alkyl group, for example, a methyl group, an ethyl group, a propyl group, an isopropyl group and a butyl group. More preferred examples thereof include a methyl group, an ethyl group, a propyl group and an isopropyl group. Examples of the alkoxy group include an alkoxy group having from 1 to 4 carbon atoms, for example, a methoxy group, an ethoxy group, a propoxy group or a butoxy group. Examples of the substituent that the alkyl group or alkoxy group may have include a hydroxy group, a halogen atom and an alkoxy group (preferably having from 1 to 4 carbon atoms). Examples of the halogen atom include a chlorine atom, a bromine atom, a fluorine atom and an iodine atom. $r_1$ represents an integer of from 1 to 10.

Specific examples of the repeating units represented by formulae (A1) and (A2) are set forth below as corresponding monomers, but the invention should not be construed as being limited thereto.

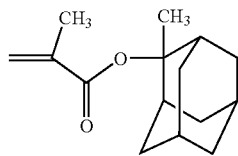

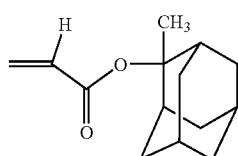

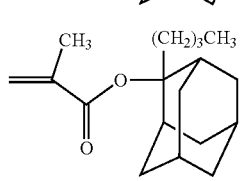

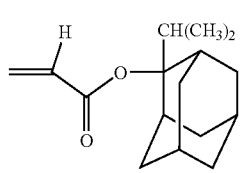

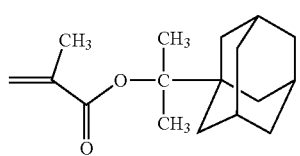

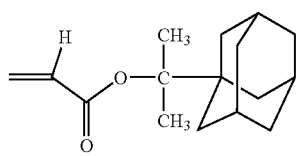

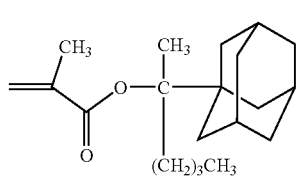

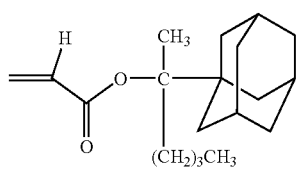

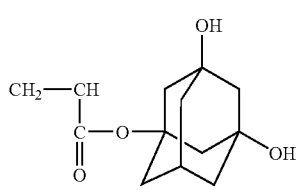

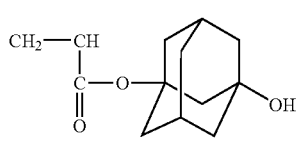

-continued

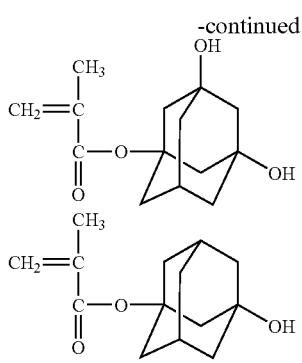

The resin (A) can further contain a repeating unit having a lactone structure represented by the following formula (IV):

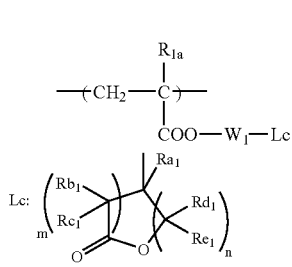

In formula (IV), $R_{1a}$ represents a hydrogen atom or a methyl group. $W_1$ represents an individual group or a combination of two or more groups selected from a single bond, an alkylene group, an ether group, a thioether group, a carbonyl group and an ester group.

$Ra_1$, $Rb_1$, $Rc_1$, $Rd_1$, and $Re_1$ each independently represents a hydrogen atom or an alkyl group having from 1 to 4 carbon atoms. m and n each independently represents an integer of from 0 to 3, provided that m+n is from 2 to 6.

Examples of the alkyl group having from 1 to 4 carbon atoms for any one of $Ra_1$ to $Re_1$ include a methyl group, an ethyl group, a propyl group, an isopropyl group, a n-butyl group, an isobutyl group, a sec-butyl group and a tert-butyl group.

In formula (IV), examples of the alkylene group represented by $W_1$ include groups represented by the following formula:

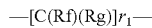

In the above formula, Rf and Rg, which may be the same or different, each represents a hydrogen atom, an alkyl group, a halogen atom, a hydroxy group or an alkoxy group. Preferred examples of the alkyl group include a lower alkyl group, for example, a methyl group, an ethyl group, a propyl group, an isopropyl group and a butyl group. More preferred examples thereof include a methyl group, an ethyl group, a propyl group and an isopropyl group. Examples of the alkoxy group include an alkoxy group have from 1 to 4 carbon atoms, for example, a methoxy group, an ethoxy group, a propoxy group and a butoxy group. Examples of the halogen atom include a chlorine atom, a bromine atom, a fluorine atom and an iodine atom. Examples of the substituent that the alkyl group or alkoxy group may have include a hydroxy group, a halogen atom and an alkoxy group (preferably have from 1 to 4 carbon atoms). $r_1$ represents an integer of from 1 to 10.

Examples of the substituent that the alkyl group represented by any one of $Ra_1$ to $Re_1$ may have include a carboxy group, an acyloxy group, a cyano group, an alkyl group, a halogen atom, a hydroxy group, an alkoxy group, an acetylamido group, an alkoxycarbonyl group and an acyl group.

Examples of the alkyl group include a lower alkyl group, for example, a methyl group, an ethyl group, a propyl group, an isopropyl group, a butyl group, a cyclopropyl group, a cyclobutyl group and a cyclopentyl group. Examples of the alkoxy group include an alkoxy group having from 1 to 4 carbon atoms, for example, a methoxy group, an ethoxy group, a propoxy group or a butoxy group. Examples of the acyloxy group include, for example, an acetoxy group. Examples of the halogen atom include, for example, a chlorine atom, a bromine atom, a fluorine atom and an iodine atom.

Specific examples of the repeating unit represented by formula (IV) are set forth below, but the invention should not be construed as being limited thereto.

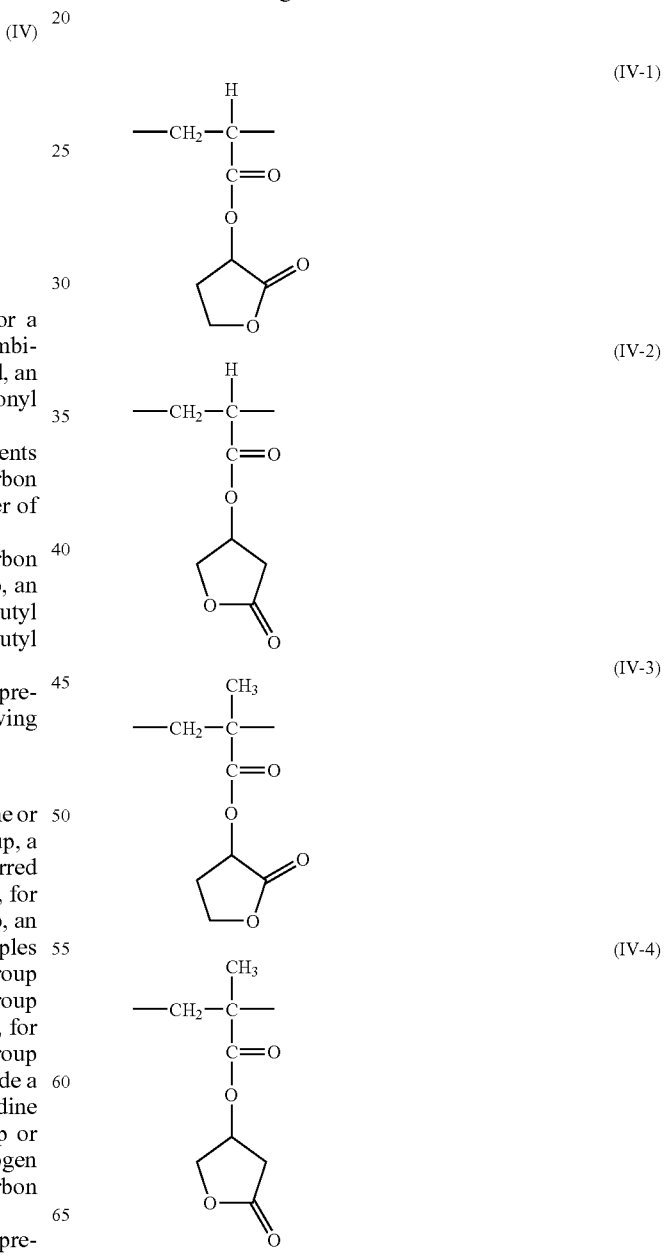

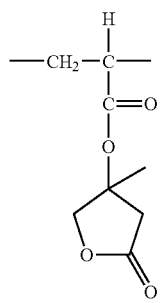 (IV-5)
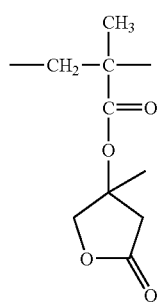 (IV-6)
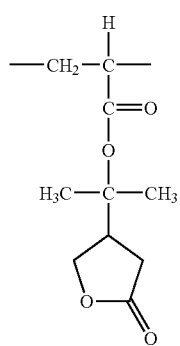 (IV-7)
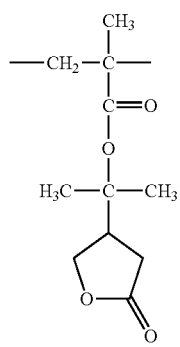 (IV-8)
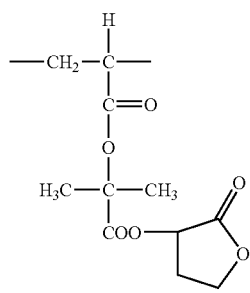 (IV-9)
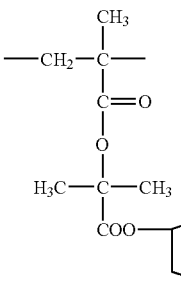 (IV-10)
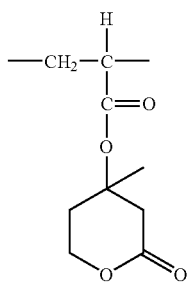 (IV-11)
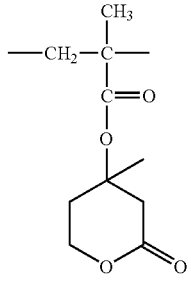 (IV-12)
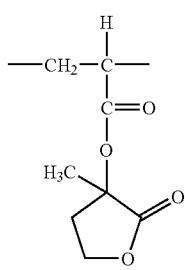 (IV-13)
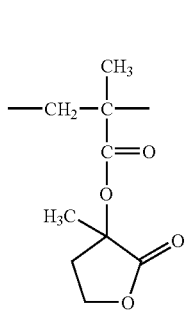 (IV-14)

-continued
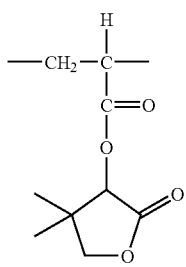
(IV-15)
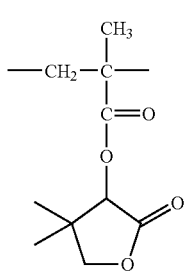
(IV-16)
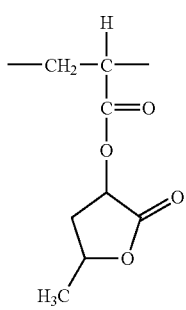
(IV-17)
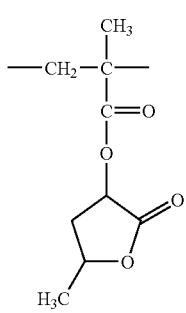
(IV-18)
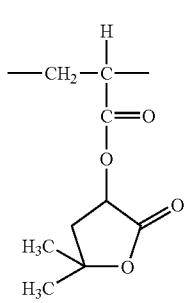
(IV-19)
-continued
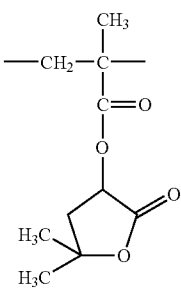
(IV-20)
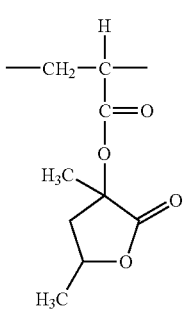
(IV-21)
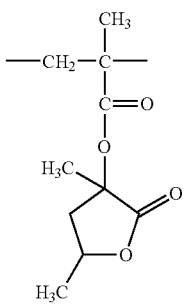
(IV-22)
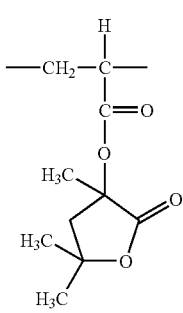
(IV-23)
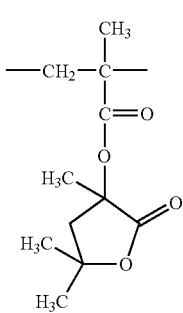
(IV-24)

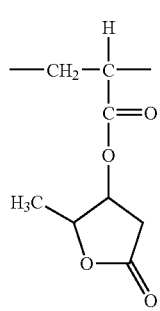 (IV-25)
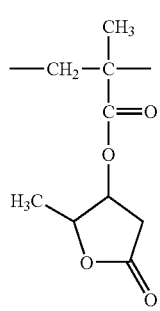 (IV-26)
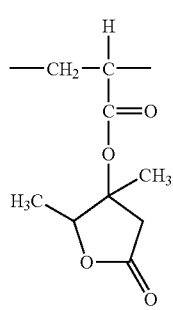 (IV-27)
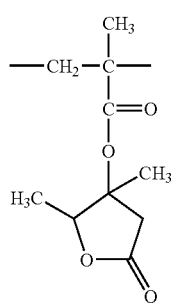 (IV-28)
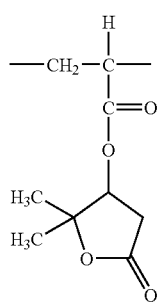 (IV-29)
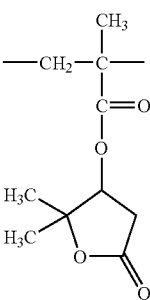 (IV-30)
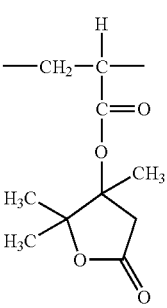 (IV-31)
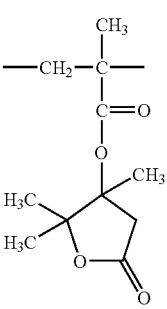 (IV-32)
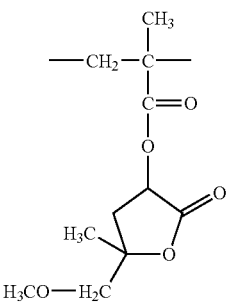 (IV-33)
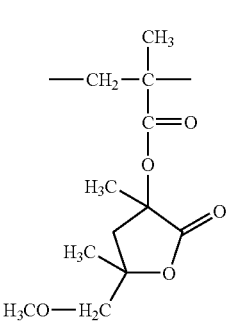 (IV-34)

-continued

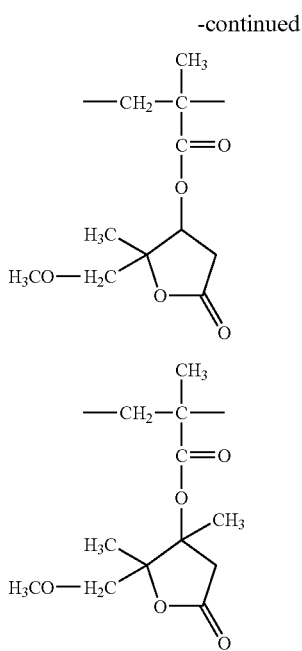

(IV-35)

(IV-36)

Of the specific examples of repeating unit represented by formula (IV), (IV-17) to (IV-36) are preferred in the point that they provide better exposure latitude.

As to the structure of repeating unit represented by formula (IV), the repeating unit having an acrylate structure is preferred in the point that it provides a good edge roughness.

Moreover, the resin (A) may contain a repeating unit represented by any one of the following formulae (V-1) to (V-4).

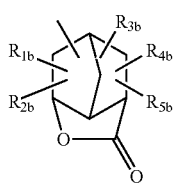

(V-1)

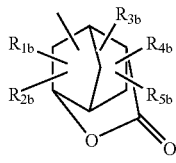

(V-2)

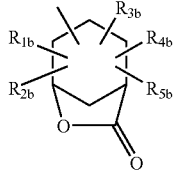

(V-3)

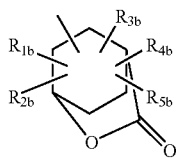

(V-4)

In formulae (V-1) to (V-4), $R_{1b}$ to $R_{5b}$ each independently represents a hydrogen atom, an alkyl group, a cycloalkyl group or an alkenyl group. Alternatively, two of $R_{1b}$ to $R_{5b}$ may be connected to each other to form a ring.

In formulae (V-1) to (V-4), the alkyl group represented by any one of $R_{1b}$ to $R_{5b}$ may be a straight chain alkyl group or a branched alkyl group.

Preferred examples of the straight chain or branched alkyl group include a straight chain or branched alkyl group having from 1 to 12 carbon atoms. More Preferred examples thereof include a straight chain or branched alkyl group having from 1 to 10 carbon atoms. Still more preferred examples thereof include a methyl group, an ethyl group, a propyl group, an isopropyl group, a n-butyl group, an isobutyl group, a sec-butyl group, a tert-butyl group, a pentyl group, a hexyl group, a heptyl group, an octyl group, a nonyl group and a decyl group.

Preferred examples of the cycloalkyl group represented by any one of $R_{1b}$ to $R_{5b}$ include a cycloalkyl group having from 3 to 8 carbon atoms, for example, a cyclopropyl group, a cyclopentyl group, a cyclohexyl group, a cycloheptyl group or a cyclooctyl group.

Preferred examples of the alkenyl group represented by any one of $R_{1b}$ to $R_{5b}$ include an alkenyl group having from 2 to 6 carbon atoms, for example, a vinyl group, a propenyl group, a butenyl group and a hexenyl group.

Also, examples of the ring formed by two of $R_{1b}$ to $R_{5b}$ connected to each other include 3- to 8-membered rings, for example, a cyclopropane ring, a cyclobutane ring, a cyclopentane ring, a cyclohexane ring and a cyclooctane ring.

$R_{1b}$ to $R_{5b}$ in formulae (V-1) to (V-4) may be connected to any one of the carbon atoms that constitute the cyclic skeleton.

Preferred examples of the substituent that the alkyl group, cycloalkyl group and alkenyl group may have include an alkoxy group having from 1 to 4 carbon atoms, a halogen atom (e.g., a fluorine atom, a chlorine atom, a bromine atom or an iodine atom), an acyl group having from 2 to 5 carbon atoms, an acyloxy group having from 2 to 5 carbon atoms, a cyano group, a hydroxy group, a carboxy group, an alkoxycarbonyl group having from 2 to 5 carbon atoms and a nitro group.

Examples of the repeating unit having the group represented by any one of formulae (V-1) to (V-4) include a repeating unit represented by the following formula (AI).

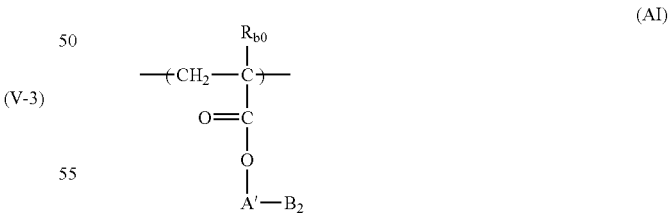

(AI)

In formula (AI), $R_{b0}$ represents a hydrogen atom, a halogen atom or an alkyl group having from 1 to 4 carbon atoms. Preferred examples of the substituent that the alkyl group represented by $R_{b0}$ may have include those described for the preferred examples of the substituent for the alkyl group represented by $R_{1b}$ in any one of formulae (V-1) to (V-4).

Examples of the halogen atom represented by $R_{b0}$ include a fluorine atom, a chlorine atom, a bromine atom and an iodine atom. $R_{b0}$ preferably represents a hydrogen atom.

A' represents a single bond, an ether group, an ester group, a carbonyl group, an alkylene group or a divalent group of a combination thereof.

B₂ represents a group represented by any one of formulae (V-1) to (V-4).

In A', examples of the divalent group of the combination include those represented by the following formulae.

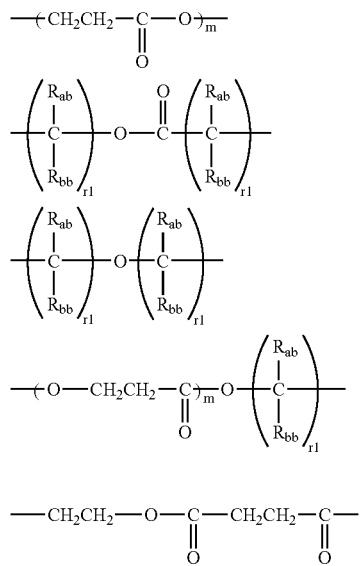

In the above formulae, $R_{ab}$ and $R_{bb}$, which may be the same or different, each independently represents a hydrogen atom, an alkyl group, a halogen atom, a hydroxy group or an alkoxy group.

Preferred examples of the alkyl group include a lower alkyl group, for example, a methyl group, an ethyl group, a propyl group, an isopropyl group or a butyl group. More preferred examples thereof include a methyl group, an ethyl group, a propyl group and an isopropyl group. Examples of the alkoxy group include an alkoxy group having from 1 to 4 carbon atoms, for example, a methoxy group, an ethoxy group, a propoxy group or a butoxy group. Examples of the substituent that the alkyl group or alkoxy group may have include a hydroxy group, a halogen atom and an alkoxy group having from 1 to 4 carbon atoms. Examples of the halogen atom include a chlorine atom, a bromine atom, a fluorine atom and an iodine atom. r1 represents an integer of from 1 to 10, preferably from 1 to 4. m represents an integer of from 1 to 3, preferably 1 or 2.

Specific examples of the repeating unit represented by formula (AI) are set forth below, but the invention should not be construed as being limited thereto.

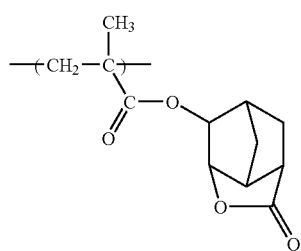

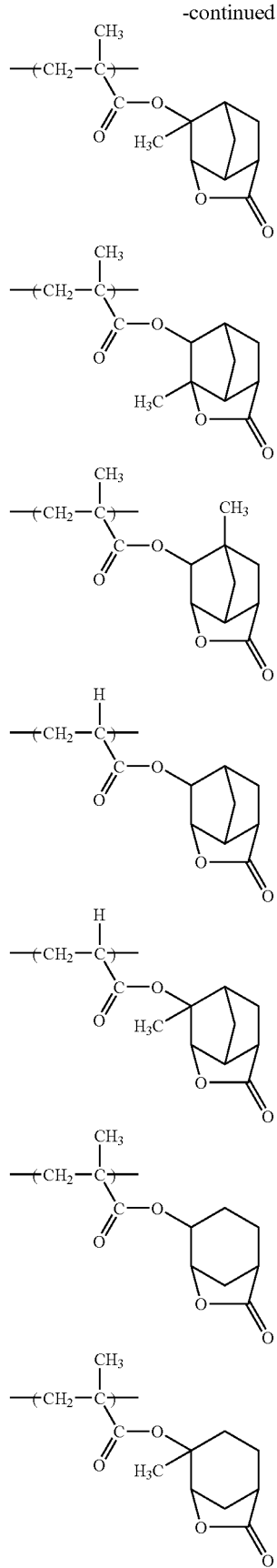

-continued
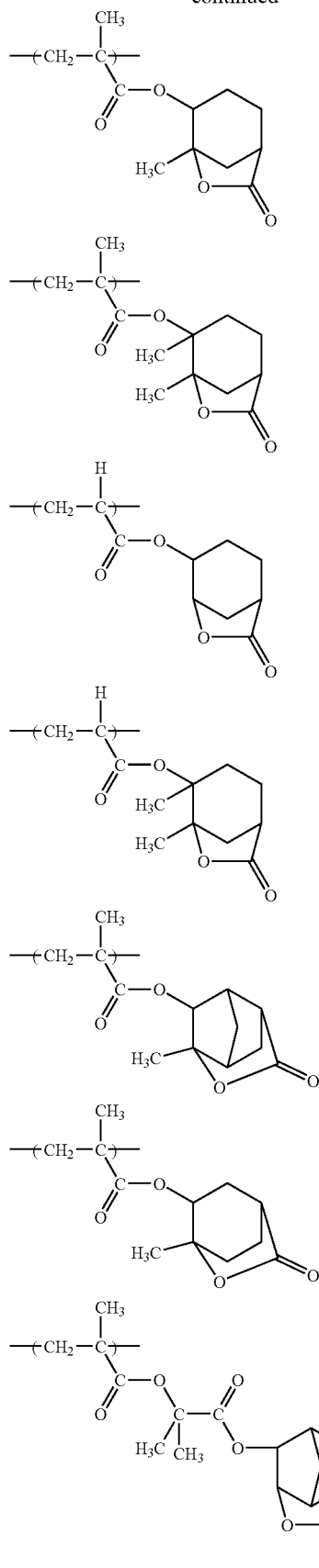
-continued
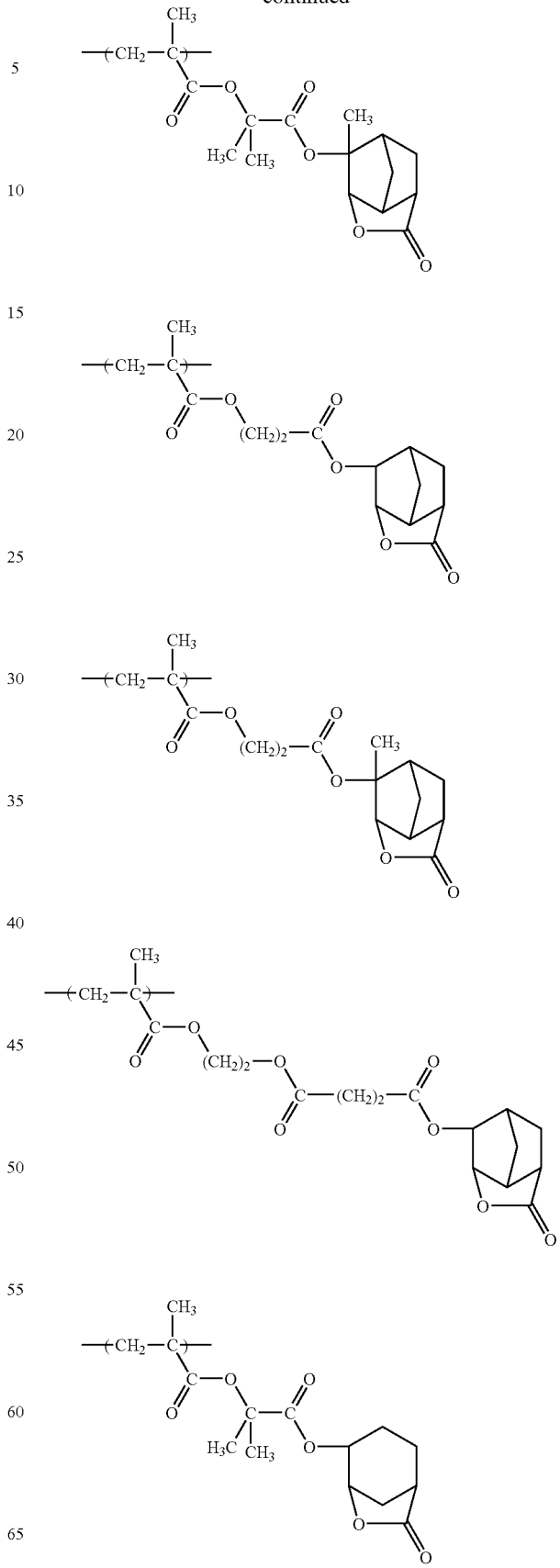

31
-continued
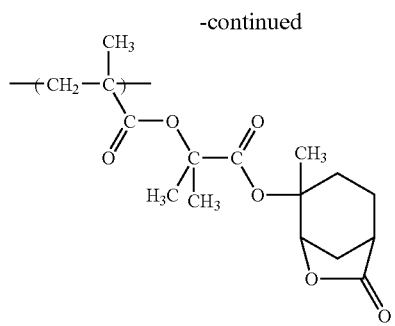
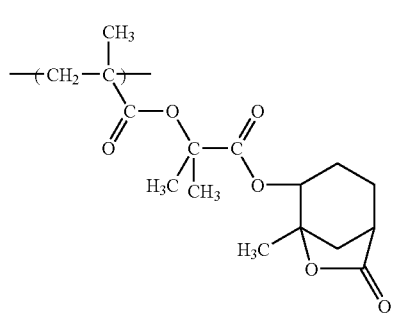
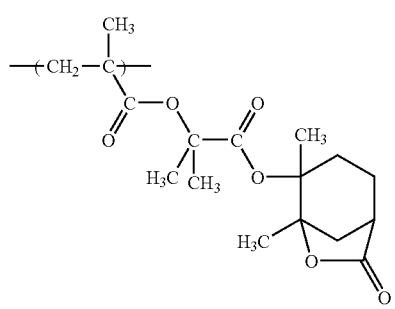
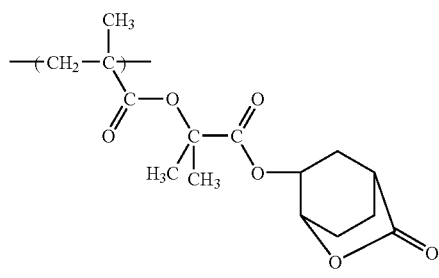
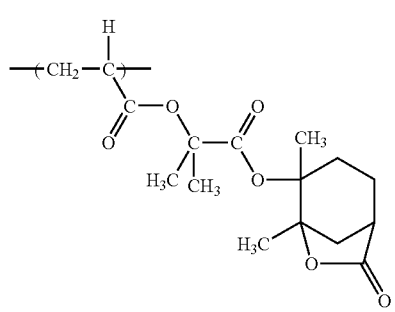
32
-continued
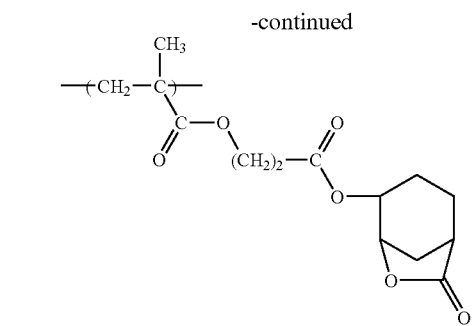
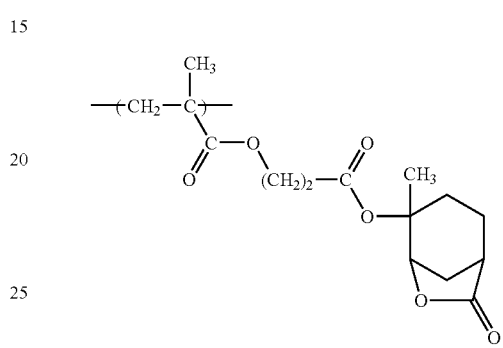
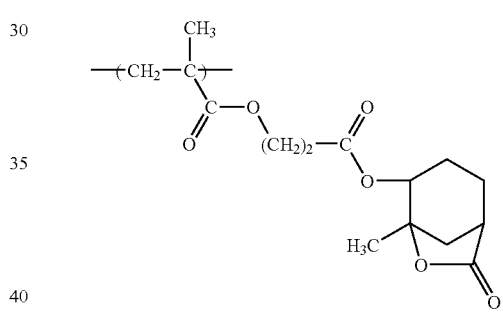
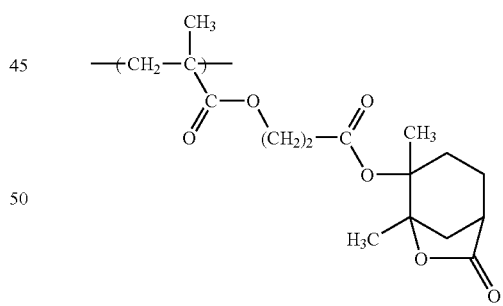
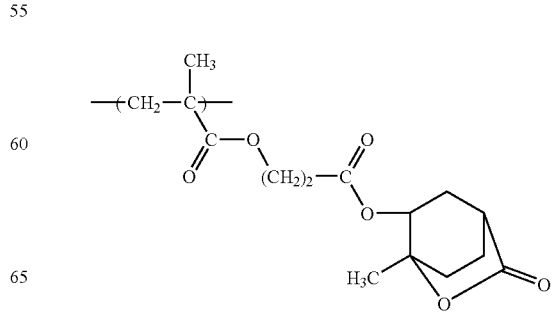

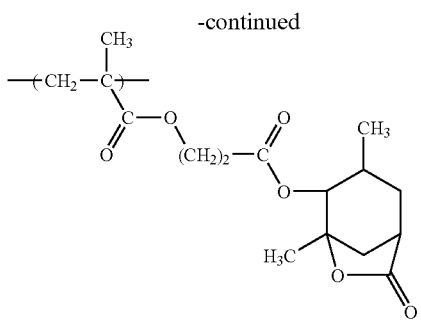

The resin (A) may further contain a repeating unit represented by the following formula (VI).

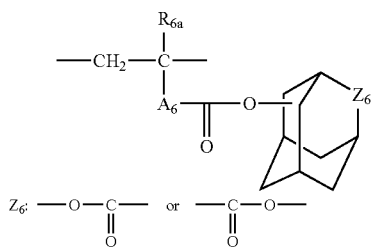

In formula (VI), $A_6$ represents an individual group or a combination of two or more groups selected from a single bond, an alkylene group, a cycloalkylene group, an ether group, a thioether group, a carbonyl group and an ester group.

$R_{6a}$ represents a hydrogen atom, an alkyl group having from 1 to 4 carbon atoms, a cyano group or a halogen atom.

In formula (VI), examples of the alkylene group represented by $A_6$ include groups represented by the following formula:

—[C(Rnf)(Rng)]$r$—

In the above formula, Rnf and Rng, which may be the same or different, each represents a hydrogen atom, an alkyl group, a halogen atom, a hydroxy group or an alkoxy group.

Preferred examples of the alkyl group include a lower alkyl group, for example, a methyl group, an ethyl group, a propyl group, an isopropyl group or a butyl groups. More preferred examples thereof include a methyl group, an ethyl group, a propyl group and an isopropyl groups. Examples of the alkoxy group include an alkoxy group having from 1 to 4 carbon atoms, for example, a methoxy group, an ethoxy group, a propoxy group and a butoxy group. Examples of the substituent that the alkyl group or alkoxy group may have include a hydroxy group, a halogen atom and an alkoxy group. Examples of the halogen atom include a chlorine atom, a bromine atom, a fluorine atom and an iodine atom. r represents an integer of from 1 to 10.

In formula (VI), examples of the cycloalkylene group represented by $A_6$ include a cycloalkylene group having from 3 to 10 carbon atoms, for example, a cyclopentylene group, a cyclohexylene group and a cyclooctylene group.

Examples of the substituent that the bridged alicyclic ring including $Z_6$ may have include a halogen atom, an alkoxy group (preferably having from 1 to 4 carbon atoms), an alkoxycarbonyl group (preferably having from 1 to 5 carbon atoms), an acyl group (for example, a formyl group or a benzoyl group), an acyloxy group (for example, a propylcar- bonyloxy group or a benzoyloxy group), an alkyl group (preferably having from 1 to 4 carbon atoms), a carboxy group, a hydroxy group and an alkylsulfonylsulfamoyl group (for example, —SO$_2$NHSO$_2$CH$_3$). The alkyl group as the substituent may further be substituted, for example, with a hydroxy group, a halogen atom or an alkoxy group (preferably having from 1 to 4 carbon atoms).

In formula (VI), the oxygen atom of the ester group connected to $A_6$ may be connected to any one of the carbon atoms constituting the $Z_6$-containing bridged alicyclic ring structure.

Specific examples of the repeating unit represented by formula (VI) are set forth below, but the invention should not be construed as being limited thereto.

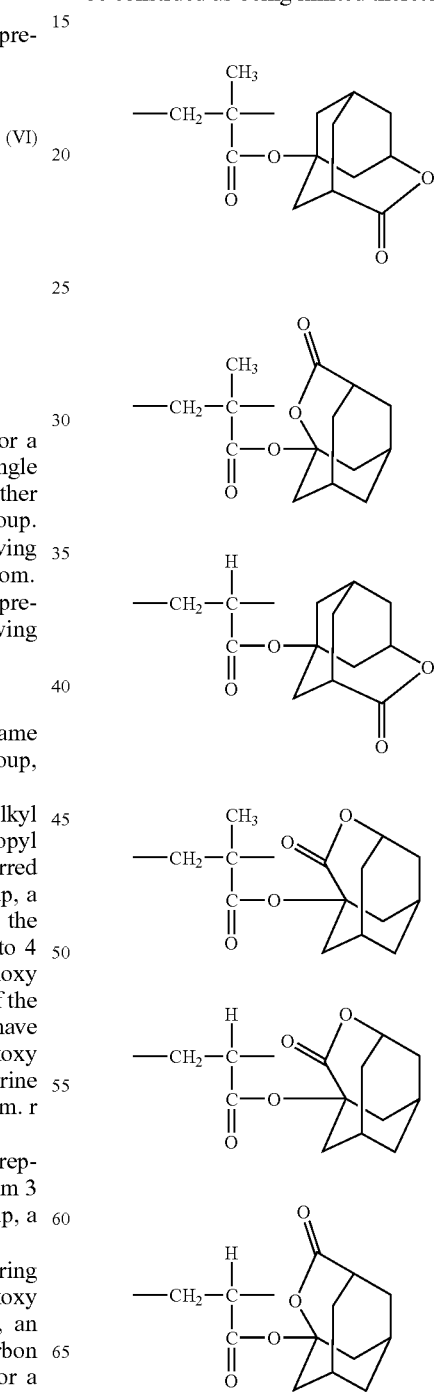

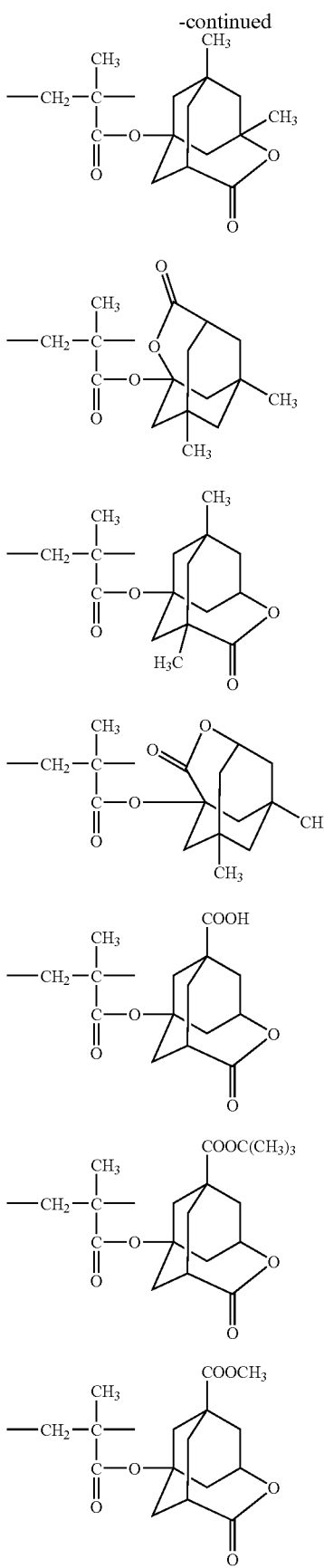
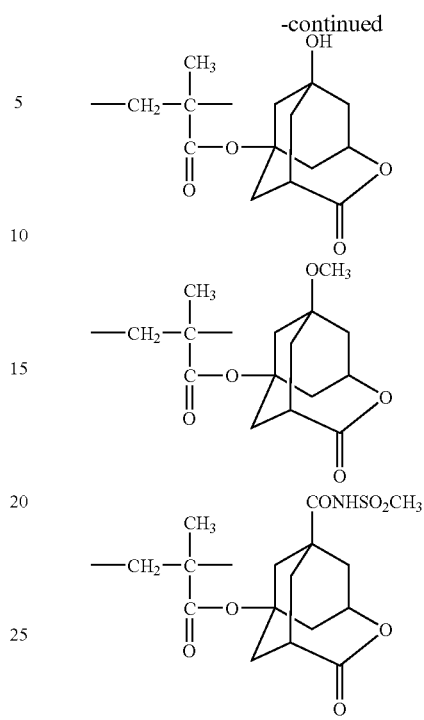

The resin (A) may further contain various repeating units in addition to the above repeating units for the purpose of adjusting dry etching resistance, standard developing solution aptitude, adhesion to a substrate, resist profile, and other characteristics ordinarily required for resist, for example, resolution, heat resistance and sensitivity.

Examples of such repeating units include repeating units corresponding to monomers described below, but the invention should not be construed as being limited thereto.

The introduction of such an additional repeating unit makes possible the fine control of characteristics required for the resin, particularly (1) solubility in a coating solvent, (2) film forming property (glass transition point), (3) alkali developing property, (4) reduction in a film thickness (hydrophilicity-hydrophobicity, selection of alkali-soluble group), (5) adhesion of the unexposed area to a substrate, and (6) dry etching resistance.

Examples of the monomers include compounds having one addition-polymerizable unsaturated bond, for example, acrylates, methacrylates, acrylamides, methacrylamides, allyl compounds, vinyl ethers and vinyl esters.

In addition, any addition-polymerizable unsaturated compounds copolymerizable with monomers corresponding to the repeating units described above may be employed.

A molar ratio of each repeating unit in the resin (A) can be appropriately determined taking the adjustment of many factors including dry etching resistance of resist, standard developing solution aptitude, adhesion to a substrate, resist profile, and other characteristics ordinarily required for resist, for example, resolution, heat resistance and sensitivity into consideration.

A content of the repeating unit having an alicyclic structure is preferably from 30 to 100% by mole, more preferably from 35 to 100% by mole, and still more preferably from 40 to 100% by mole, based on the total repeating units constituting the resin (A).

A content of the repeating unit having an acid-decomposable group is preferably from 15 to 70% by mole, more preferably from 20 to 65% by mole, and still more preferably from 25 to 60% by mole, based on the total repeating units constituting the resin (A).

A total content of the repeating unit having a partial structure containing an alicyclic hydrocarbon represented by any one of formulae (pI) to (pVI) and the repeating unit represented by any one of formulae (A1) and (A2) is preferably from 30 to 70% by mole, more preferably from 35 to 65% by mole, and still more preferably from 40 to 60% by mole, based on the total repeating units constituting the resin (A).

A content of the repeating unit having a hydroxyadamantane structure represented by formula (I) is preferably from 5 to 50% by mole, more preferably from 10 to 40% by mole, and still more preferably from 15 to 35% by mole, based on the total repeating units constituting the resin (A).

A content of the repeating unit corresponding to the additional copolymer component described above can also be appropriately determined depending on the desired performances of resist.

The resin (A) can be synthesized according to conventional methods, for example, radical polymerization. For instance, in an ordinary synthesis method, monomers are put into a reaction vessel at once or separately during the reaction, dissolved in a reaction solvent, for example, an ether, e.g., tetrahydrofuran, 1,4-dioxane or diisopropyl ether, a ketone, e.g., methyl ethyl ketone or methyl isobutyl ketone, an ester, e.g., ethyl acetate, or a solvent dissolving the composition of the invention described hereinafter, e.g., propylene glycol monomethyl ether acetate, if desired, to form a uniform solution, and under inert gas atmosphere, for example, nitrogen or argon, polymerization is initiated using a commercially available radical initiator (e.g., an azo initiator or a peroxide) while heating, if desired. The initiator is further added or separately added, if desired. After the completion of the reaction, the reaction mixture is poured into a solvent to collect the resulting powder or solid, thereby obtaining the desired polymer.

The concentration of reaction is ordinarily 20% by weight or more, preferably 30% by weight or more, and more preferably 40% by weight or more. The reaction temperature is ordinarily from 10 to 150° C., preferably from 30 to 120° C., and more preferably from 50 to 100° C.

The repeating structural units above-described may be used individually or as a mixture of two or more thereof.

A weight average molecular weight of the resin (A) in accordance with the invention is preferably from 1,000 to 200,000, more preferably from 3,000 to 20,000 measured by a GPC method and calculated in terms of polystyrene. The weight average molecular weight is preferably 1,000 or more in view of the heat resistance and dry etching resistance and 200,000 or less in view of the developing property and film forming property.

The molecular weight distribution (Mw/Mn) is ordinarily from 1 to 10, preferably from 1 to 5, still more preferably from 1 to 4. A resin having a smaller molecular weight distribution shows a better resolution, and provides a better resist profile and a smoother side wall of a resulting resist pattern, thus being excellent in roughness.

The total amount of the resin (A) in the photosensitive composition of the invention is preferably from 40 to 99.99% by weight, and more preferably from 50 to 99.97% by weight, based on the total solid content of the composition.

[2] (B) Compound that Generates an Acid Upon Irradiation of an Actinic Ray or Radiation A compound that generates an acid upon irradiation of an actinic ray or radiation (hereinafter also referred to as an "acid generator") for use in the photosensitive composition of the invention will be described below.

The acid generator for use in the invention can be selected from compounds ordinarily used as acid generators.

Specifically, the acid generator can be appropriately selected from photoinitiators for photo-cationic polymerization, photoinitiators for photo-radical polymerization, photoachromatic agents for dyes, photo-discoloring agents, known compounds generating an acid upon irradiation of an actinic ray or radiation, for example, a far ultraviolet ray, an electron beam, an X ray or an ion beam, used for a microresist and mixtures thereof.

Examples of the acid generator include a diazonium salt, a phosphonium salt, a sulfonium salt, an iodonium salt, an imidosulfonate, an oxime sulfonate, a diazodisulfone, a disulfone and an o-nitrobenzyl sulfonate.

Also, polymer compounds in which a group or compound generating an acid upon irradiation of an actinic ray or radiation is introduced into the main chain or side chain thereof, for example, compounds described, for example, in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029 may be used.

Further, compounds generating an acid by light described, for example, in U.S. Pat. No. 3,779,778 and European Patent 126,712 may be used.

Preferred examples of the acid generator include compounds represented by the following formulae (ZI), (ZII) and (ZIII).

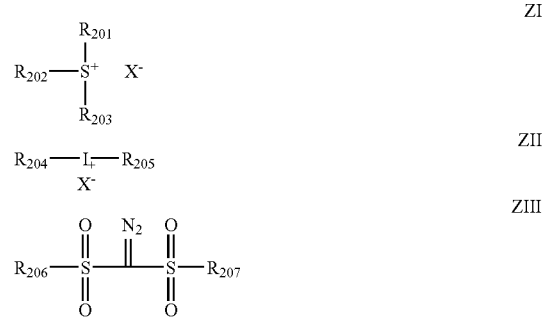

In formula (ZI), $R_{201}$, $R_{202}$ and $R_{203}$ each independently represents an organic group.

$X^-$ represents a non-nucleophilic anion.

A number of carbon atoms included in the organic group represented by any one of $R_{201}$, $R_{202}$ and $R_{203}$ is ordinarily from 1 to 30, and preferably from 1 to 20.

Also, two of $R_{201}$, $R_{202}$ and $R_{203}$ may be connected to each other to from a ring structure, and the ring structure may include an oxygen atom, a sulfur atom, an ester bond, an amido bond or a carbonyl group.

A group formed by combining two of $R_{201}$, $R_{202}$ and $R_{203}$ include an alkylene group (for example, a butylene group or a pentylene group).

Specific examples of the organic group represented by any one of $R_{201}$, $R_{202}$ and $R_{203}$ include the corresponding groups in Compounds (Z1-1), (Z1-2) and (Z1-3) described below.

Compounds having two or more of the structures represented by formula (ZI) may also be used. For example, a compound having a structure in which at least one of $R_{201}$, $R_{202}$ and $R_{203}$ in one compound represented by formula (ZI) is connected to at least one of $R_{201}$, $R_{202}$ and $R_{203}$ in another compound represented by formula (ZI).

As more preferable compounds of the compounds represented by formula (ZI), Compounds (Z1-1), (Z1-2) and (Z1-3) described below are exemplified.

Compound (Z1-1) is an arylsulfonium compound wherein at least one of $R_{201}$, $R_{202}$ and $R_{203}$ in formula (ZI) is an aryl group, that is, a compound including an arylsulfonium as a cation.

In the arylsulfonium compound, all of $R_{201}$, $R_{202}$ and $R_{203}$ may be aryl groups, or a part of $R_{201}$, $R_{202}$ and $R_{203}$ may be an aryl group and the remainder may be an alkyl group or a cycloalkyl group.

Examples of the arylsulfonium compound include triarylsulfonium compounds, diarylalkylsulfonium compounds, aryldialkylsulfonium compounds, diarylcycloalkylsulfonium compounds and aryldicycloalkylsulfonium compounds.

As the aryl group in the arylsulfonium compound, a phenyl group or a naphthyl group is preferable and a phenyl group is more preferable. When the arylsulfonium compound includes two or more aryl groups, the two or more aryl groups may be the same or different from each other.

The alkyl group, which is included in the arylsulfonium compound, if desired, is preferably a straight chain or branched alkyl group having from 1 to 15 carbon atoms and includes, for example, a methyl group, an ethyl group, a propyl group, a n-butyl group, a sec-butyl group and a tert-butyl group.

The cycloalkyl group, which is included in the arylsulfonium compound, if desired, is preferably a cycloalkyl group having from 3 to 15 carbon atoms and includes, for example, a cyclopropyl group, a cyclobutyl group and a cyclohexyl group.

The aryl group, alkyl group or cycloalkyl group represented by any one of $R_{201}$, $R_{202}$ and $R_{203}$ may have as a substituent, an alkyl group (for example, an alkyl group having from 1 to 15 carbon atoms), a cycloalkyl group having from 3 to 15 carbon atoms), an aryl group (for example, an aryl group having from 6 to 14 carbon atoms), an alkoxy group (for example, an alkoxy group having from 1 to 15 carbon atoms), a halogen atom, a hydroxy group or a phenylthio group. Preferred examples of the substituent include a straight chain or branched alkyl group having from 1 to 12 carbon atoms, a cycloalkyl group having from 3 to 12 carbon atoms and an alkoxy group having from 1 to 12 carbon atoms. An alkyl group having from 1 to 4 carbon atoms and an alkoxy group having from 1 to 4 carbon atoms are most preferred. The substituent may be substituted on any one of $R_{201}$, $R_{202}$ and $R_{203}$ or the substituents may be substituted on all of $R_{201}$, $R_{202}$ and $R_{203}$. When $R_{201}$, $R_{202}$ or $R_{203}$ represents an aryl group, the substituent is preferably substituted on the p-position of the aryl group.

The non-nucleophilic anion represented by $X^-$ includes, for example, a sulfonic acid anion, a carboxylic acid anion, a sulfonylimido anion, a bis(alkylsulfonyl)imido anion and a tris(alkylsulfonyl)methyl anion.

The non-nucleophilic anion means an anion having an extremely low ability for causing a nucleophilic reaction and an anion capable of restraining decomposition with the lapse of time by an intramolecular nucleophilic reaction. By means of the non-nucleophilic anion, preservation stability of the photosensitive composition is improved.

Examples of the sulfonic acid anion include an aliphatic sulfonic acid anion, an aromatic sulfonic acid anion and camphorsulfonic acid anion.

Examples of the carboxylic acid anion include an aliphatic carboxylic acid anion, an aromatic carboxylic acid anion and an aralkylcarboxylic acid anion.

The aliphatic moiety in the aliphatic sulfonic acid anion includes, for example, an alkyl group having from 1 to 30 carbon atoms, specifically, a methyl group, an ethyl group, a propyl group, an isopropyl group, a n-butyl group, an isobutyl group, a sec-butyl group, a pentyl group, a neopentyl group, a hexyl group, a heptyl group, an octyl group, a nonyl group, a decyl group, a undecyl group, a dodecyl group, a tridecyl group, a tetradecyl group, a pentadecyl group, a hexadecyl group, a heptadecyl group, an octadecyl group, a nonadecyl group or an eicosyl group, and a cycoalkyl group having from 3 to 30 carbon atoms, specifically, a cyclopropyl group, a cyclopentyl group, a cyclohexyl group, an adamantyl group, a norbornyl group or a bornyl group.

The aromatic group in the aromatic sulfonic acid anion is preferably an aryl group having from 6 to 14 carbon atoms, for example, a phenyl group, a tolyl group or a naphthyl group.

The alkyl group, cycloalkyl group and aryl group in the aliphatic sulfonic acid anion and aromatic sulfonic acid anion may have a substituent.

Examples of the substituent include a nitro group, a halogen atom (for example, a fluorine atom, a chlorine atom, a bromine atom or an iodine atom), a carboxy group, a hydroxy group, an amino group, a cyano group, an alkoxy group (preferably having from 1 to 5 carbon atoms), a cycloalkyl group (preferably having from 3 to 15 carbon atoms), an aryl group (preferably having from 6 to 14 carbon atoms), an alkoxycarbonyl group (preferably having from 2 to 7 carbon atoms), an acyl group (preferably having from 2 to 12 carbon atoms), an alkoxycarbonyloxy group (preferably having from 2 to 7 carbon atoms) and an alkylthio group (preferably having from 1 to 15 carbon atoms). The aryl group and ring structure included in each of these groups may further have a substituent, for example, an alkyl group (preferably having from 1 to 25 carbon atoms).

The aliphatic moiety in the aliphatic carboxylic acid anion is same as the aliphatic group in the aliphatic sulfonic acid anion.

The aromatic group in the aromatic carboxylic acid anion is same as the aromatic group in the aromatic sulfonic acid anion.

The aralkyl group in the aralkylcarboxylic acid anion is preferably an aralkyl group having from 7 to 12 carbon atoms, for example, a benzyl group, a phenethyl group, a naphthylmethyl group or a naphthylethyl group.

The aliphatic group, aromatic group and aralkyl group in the aliphatic carboxylic acid anion, aromatic carboxylic acid anion and aralkylcarboxylic acid anion may have a substituent. Examples of the substituent include those described for the aliphatic sulfonic acid anion, for example, a halogen atom, an alkyl group, a cycloalkyl group, an alkoxy group or an alkylthio group.

Examples of the sulfonylimido anion include saccharin anion.

The alkyl group in the bis(alkylsulfonyl)imido anion or tris(alkylsulfonyl)methyl anion preferably includes an alkyl group having from 1 to 5 carbon atoms, for example, a methyl group, an ethyl group, a propyl group, an isopropyl group, a n-butyl group, an isobutyl group, a sec-butyl group, a pentyl group or a neopentyl group. The alkyl group may have a substituent and examples of the substituent include a halogen atom, an alkyl group substituted with a halogen atom, an alkoxy group and an alkylthio group. Of the substituents, an alkyl group substituted with a fluorine atom is preferred.

Other examples of the non-nucleophilic anion include phosphorus fluoride, boron fluoride and antimony fluoride.

Of the non-nucleophilic anions represented by $X^-$, an aliphatic sulfonic acid anion wherein the α-position of the sulfonic acid is substituted with a fluorine atom, an aromatic sulfonic acid anion substituted with a fluorine atom or a group having a fluorine atom, a bis(alkylsulfonyl)imido anion wherein the alkyl group is substituted with a fluorine atom and a tris(alkylsulfonyl)methyl anion wherein the alkyl group is substituted with a fluorine atom are preferred. As the non-nucleophilic anions for $X^-$, a perfluoroaliphatic sulfonic anion having from 4 to 8 carbon atoms and an aromatic sulfonic acid anion having a fluorine atom are particularly preferred, and nonafluorobutanesulfonic acid anion, perfluorooctanesulfonic acid anion, a pentafluorobenzenesulfonic acid anion and a 3,5-bis(trifluoromethyl)benzenesulfonic acid anion are most preferred.

Now, Compound (Z1-2) is described below.

Compound (Z1-2) is a compound wherein $R_{201}$, $R_{202}$ and $R_{203}$ in formula (ZI) each independently represents an organic group that does not include an aromatic ring. The term "aromatic ring" used herein also includes an aromatic ring containing a hetero atom.

The organic group that does not include an aromatic ring represented by any one of $R_{201}$, $R_{202}$ and $R_{203}$ has ordinarily from 1 to 30 carbon atoms, and preferably from 1 to 20 carbon atoms.

$R_{201}$, $R_{202}$ and $R_{203}$ each independently preferably represents an alkyl group, a cycloalkyl group, an allyl group or a vinyl group, more preferably a straight chain, branched or cyclic 2-oxoalkyl group or an alkoxycarbonylmethyl group, and most preferably a straight chain or branched 2-oxoalkyl group.

The alkyl group represented by any one of $R_{201}$, $R_{202}$ and $R_{203}$ may be straight chain or branched and preferably includes a straight chain or branched alkyl group having from 1 to 10 carbon atoms (for example, a methyl group, an ethyl group, a propyl group, a butyl group or a pentyl group). More preferred examples of the alkyl group include a straight chain or branched 2-oxoalkyl group and an alkoxycarbonylmethyl group.

The cycloalkyl group represented by any one of $R_{201}$, $R_{202}$ and $R_{203}$ preferably includes a cycloalkyl group having from 3 to 10 carbon atoms (for example, a cyclopentyl group, a cyclohexyl group or a norbornyl group). More preferred examples of the cycloalkyl group include a 2-oxocycloalkyl group.

The 2-oxoalkyl group may be any one of straight chain, branched and cyclic 2-oxoalkyl groups, and preferably includes a 2-oxoalkyl group in which >C=O is present at the 2-position of each of the above-described alkyl group and cycloalkyl group.

The alkoxy group of the alkoxycarbonylmethyl group includes preferably an alkoxy group having from 1 to 5 carbon atoms (for example, a methoxy group, an ethoxy group, a propoxy group, a butoxy group or a pentoxy group).

The group represented by any one of $R_{201}$, $R_{202}$ and $R_{203}$ may further be substituted with a halogen atom, an alkoxy group (for example, an alkoxy group having from 1 to 5 carbon atoms), a hydroxy group, a cyano group or a nitro group.

Two of $R_{201}$, $R_{202}$ and $R_{203}$ may be connected to each other to from a ring structure, and the ring structure may include an oxygen atom, a sulfur atom, an ester bond, an amido bond or a carbonyl group. A group formed by connecting two of $R_{201}$, $R_{202}$ and $R_{203}$ includes an alkylene group (for example, a butylene group or a pentylene group).

Compound (Z1-3) is a compound represented by formula (Z1-3) shown below, and a compound containing a phenacylsulfonium salt structure.

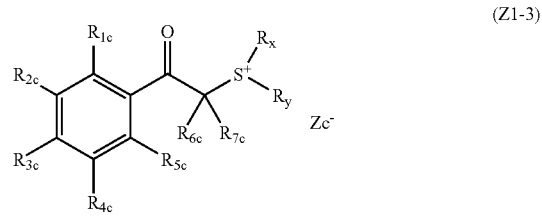

(Z1-3)

wherein $R_{1c}$ to $R_{5c}$ each independently represents a hydrogen atom, an alkyl group, a cycloalkyl group, an alkoxy group or a halogen atom.

$R_{6c}$ and $R_{7c}$ each independently represents a hydrogen atom, an alkyl group or a cycloalkyl group.

$R_x$ and $R_y$ each independently represents an alkyl group, a cycloalkyl group, an allyl group or a vinyl group.

At least any two of $R_{1c}$ to $R_{5c}$, or $R_x$ and $R_y$ may be connected to each other to form a cyclic structure, and the cyclic structure may include an oxygen atom, a sulfur atom, an ester bond or an amido bond.

$Zc^-$ represents a non-nucleophilic anion, and has the same meaning as the non-nucleophilic anion represented by $X^-$ in formula (ZI).

The alkyl group represented by any one of $R_{1c}$ to $R_{7c}$ preferably includes a straight chain or branched alkyl group having from 1 to 20 carbon atoms, for example, a methyl group, an ethyl group, a straight chain or branched propyl group, a straight chain or branched butyl group or a straight chain or branched pentyl group.

The cycloalkyl group represented by any one of $R_{1c}$ to $R_{7c}$ preferably includes a cyclic alkyl group having from 3 to 8 carbon atoms, for example, a cyclopentyl group or a cyclohexyl group.

The alkoxy group represented by any one of $R_{1c}$ to $R_{5c}$ may be any one of a straight chain, branched and cyclic alkoxy groups, and includes, for example, an alkoxy group having from 1 to 10 carbon atoms. Preferred examples thereof include a straight chain or branched alkoxy group having from 1 to 5 carbon atoms, for example, a methoxy group, an ethoxy group, a straight chain or branched propoxy group, a straight chain or branched butoxy group or a straight chain or branched pentoxy group and a cyclic alkoxy group having from 3 to 8 carbon atoms, for example, a cyclopentyloxy group or a cyclohexyloxy group.

Preferably, any one of $R_{1c}$ to $R_{5c}$ represents a straight chain or branched alkyl group, a cycloalkyl group or a straight chain, branched or cyclic alkoxy group, and more preferably, the total number of carbon atoms included in $R_{1c}$ to $R_{5c}$ is from 2 to 15. This makes it possible to improve solubility in a solvent, whereby the generation of particles during preservation of the composition is restrained.

The alkyl group and cycloalkyl group for any one of $R_x$ and $R_y$ are same as the alkyl group and cycloalkyl group for any one of $R_{1c}$ to $R_{7c}$ respectively, and preferably includes a 2-oxoalkyl group, a 2-oxocycloalkyl group and an alkoxycarbonylmethyl group.

Examples of the 2-oxoalkyl group or 2-oxocycloalkyl group include those having >C=O at the 2-position of the alkyl group or cycloalkyl group for any one of $R_{1c}$ to $R_{7c}$.

The alkoxy group of the alkoxycarbonylmethyl group is same as the alkoxy group for any one of $R_{1c}$ to $R_{5c}$.

Examples of the group formed by connecting $R_x$ and $R_y$ include a butylene group and a pentylene group.

$R_x$ and $R_y$ each preferably represents an alkyl group having 4 or more carbon atoms, more preferably an alkyl group having 6 or more carbon atoms, and still more preferably an alkyl group having 8 or more carbon atoms.

In formula (ZII) or (ZIII), $R_{204}$ to $R_{207}$ each independently represents an aryl group, an alkyl group or a cycloalkyl group.

The aryl group represented by any one of $R_{204}$ to $R_{207}$ is preferably a phenyl group or a naphthyl group, and more preferably a phenyl group.

The alkyl group represented by any one of $R_{204}$ to $R_{207}$ preferably includes a straight chain or branched alkyl group having from 1 to 10 carbon atoms, for example, a methyl group, an ethyl group, a propyl group, a butyl group or a pentyl group.

The cycloalkyl group represented by any one of $R_{204}$ to $R_{207}$ preferably includes a cyclic alkyl group having from 3 to 10 carbon atoms, for example, a cyclopentyl group, a cyclohexyl group or a norbornyl group.

The substituent that the group represented by any one of $R_{204}$ to $R_{207}$ may have includes an alkyl group (for example, an alkyl group having from 1 to 15 carbon atoms), a cycloalkyl group (for example, a cycloalkyl group having from 3 to 15 carbon atoms), an aryl group (for example, an aryl group having from 6 to 15 carbon atoms), an alkoxy group (for example, an alkoxy group having from 1 to 15 carbon atoms), a halogen atom, a hydroxy group or a phenylthio group.

$X^-$ represents a non-nucleophilic anion, and has the same meaning as the non-nucleophilic anion represented by $X^-$ in formula (ZI).

Preferred examples of the acid generator further include compounds represented by the following formulae (ZIV), (ZV) and (ZVI)

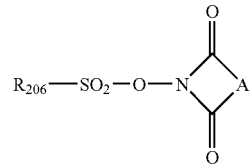

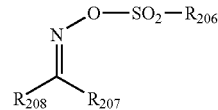

In formulae (ZIV) to (ZVI), $Ar_3$ and $Ar_4$ each independently represents an aryl group.

$R_{206}$, $R_{207}$ and $R_{208}$ each independently represents an alkyl group, a cycloalkyl group or an aryl group. These groups have the same meanings as the alkyl group, cycloalkyl group and aryl group defined for $R_{204}$ to $R_{207}$ respectively.

A represents an alkylene group, an alkenylene group or an arylene group.

Of the acid generators, the compounds represented by formulae (Z1) to (ZIII) are more preferred.

Particularly preferred examples of the compound that generates an acid upon irradiation with an actinic ray or radiation are set forth below.

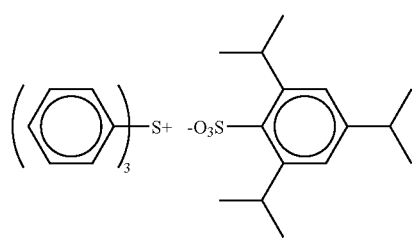

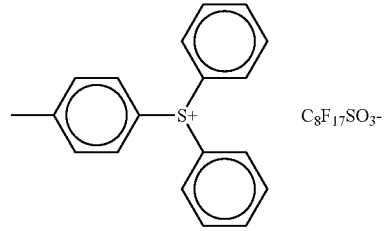

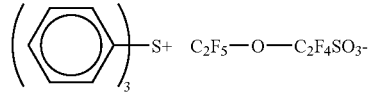

-continued
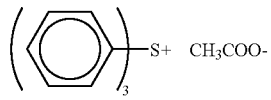
(z9)
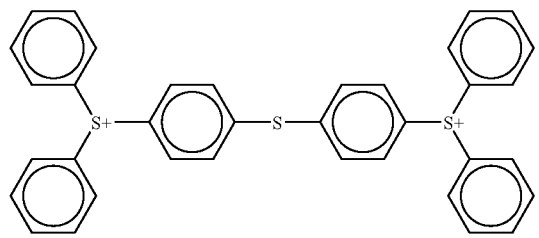
(z10)
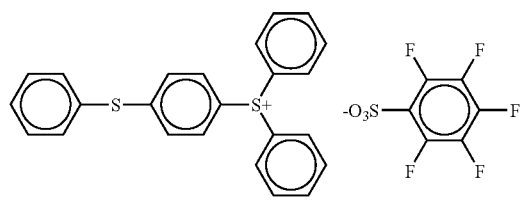
(z11)
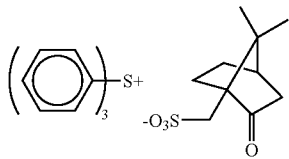
(z12)
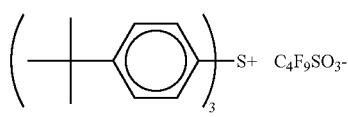
(z13)
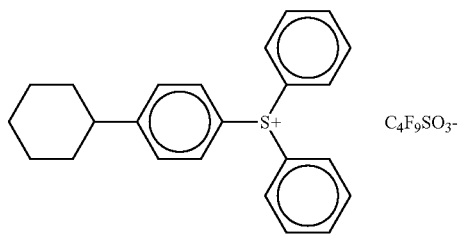
(z14)
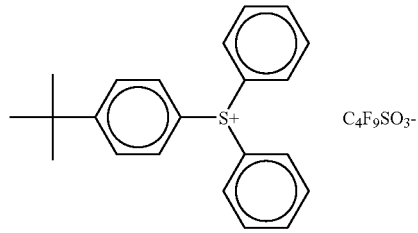
(z15)
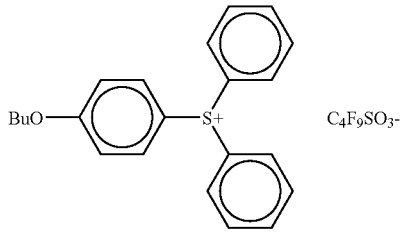
(z16)
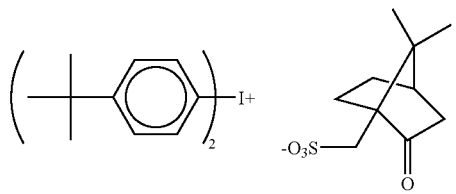
(z17)
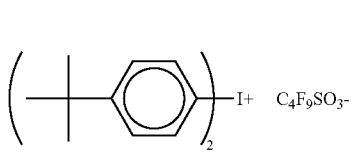
(z18)
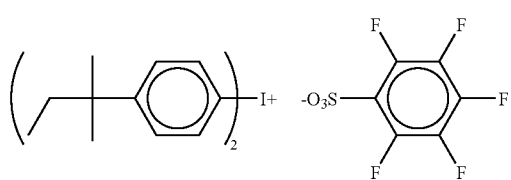
(z19)
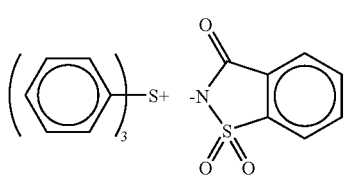
(z20)
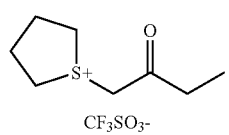
(z21)
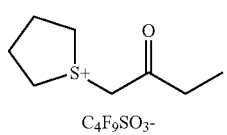
(z22)

-continued
(z23)
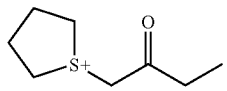
C8F17SO3-
(z24)
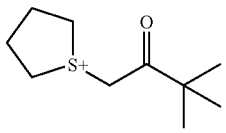
CF3SO3-
(z25)
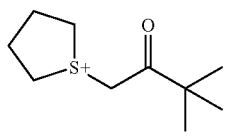
C4F9SO3-
(z26)
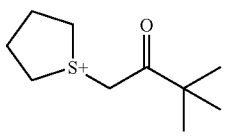
C8F17SO3-
(z27)
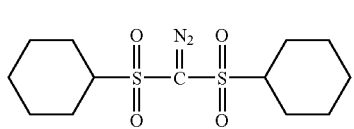
(z28)
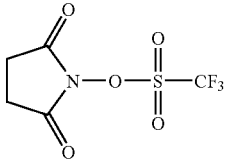
(z29)
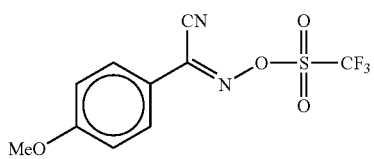
(z30)
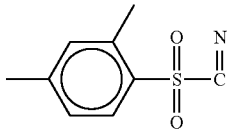
(z31)
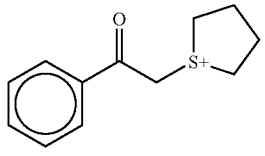
(z32)
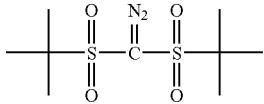
(z33)
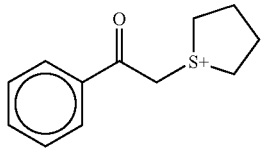
(z34)
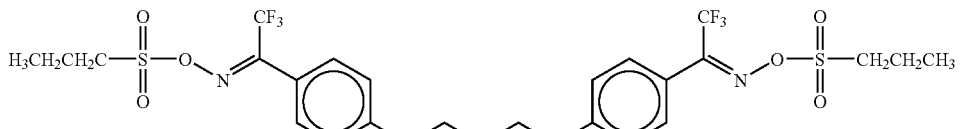
(z35)
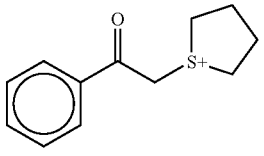
CF3SO3-
(z36)
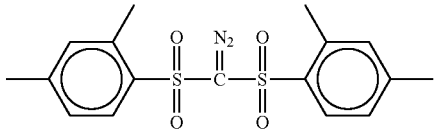
C4F9SO3-
(z37)
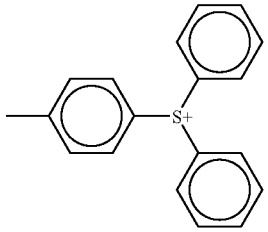
C8F17SO3-
(z38)
C4F9SO3-

-continued
(z39)
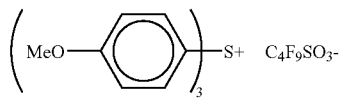
(z40)
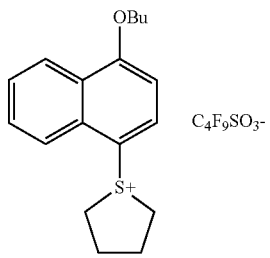
(z41)
(z42)
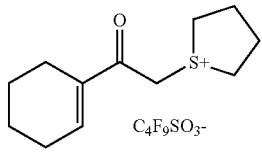
(z43)
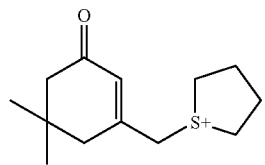
(z44)
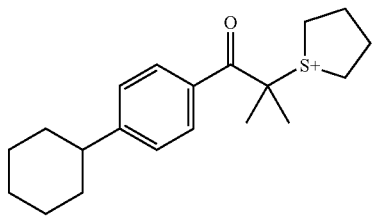
(z45)
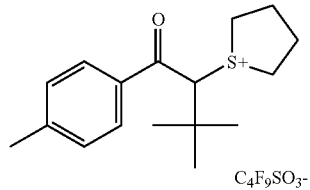
(z46)
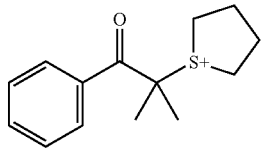
(z47)
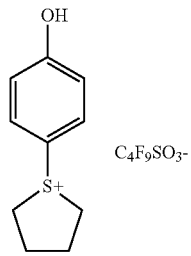
(z48)
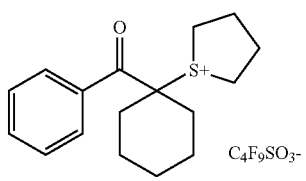
(z49)
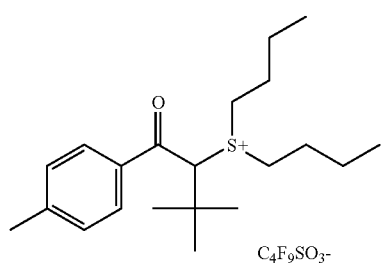
(z50)
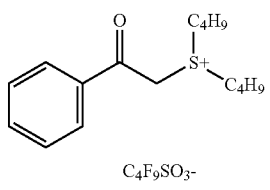
(z51)
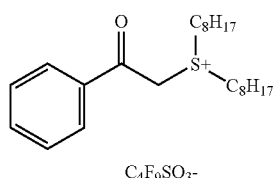
(z52)
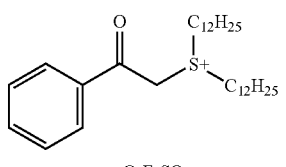

(z53) 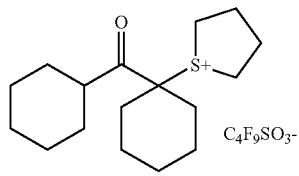

(z54) 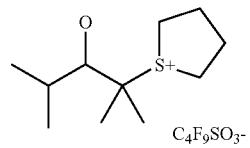

(z55) 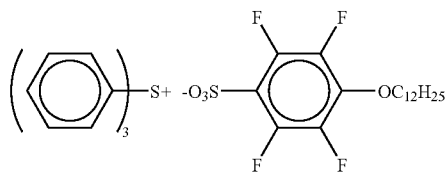

(z56) 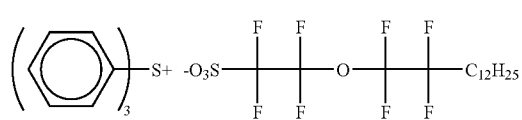

(z57) 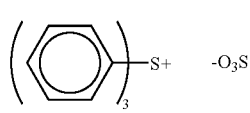 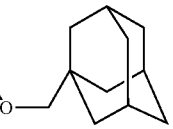

(z58) 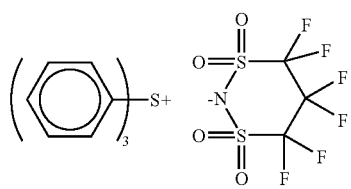

(z59) 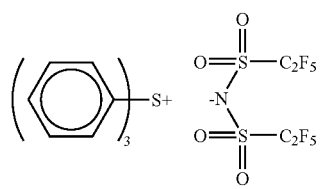

The acid generators may be used individually or in combination of two or more thereof.

A content of the acid generator in the photosensitive composition is preferably from 0.1 to 20% by weight, more preferably from 0.5 to 10% by weight, and still more preferably from 1 to 7% by weight, based on the total solid content of the photosensitive composition.

[3] Compound Having a Molecular Weight of 1,000 or Less and Containing an Aliphatic Ring and an Aromatic Ring (C1)

The aliphatic ring is preferably an aliphatic ring having from 3 to 20 carbon atoms, and more preferably an aliphatic ring having from 3 to 15 carbon atoms.

Examples of the aliphatic ring are set forth below.

(1) 

(2) 

(3) 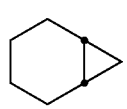

(4) 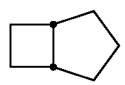

(5) 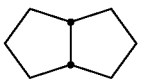

(6) 

(7) 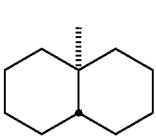

(8) 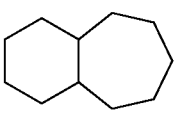

(9) 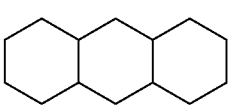

(10) 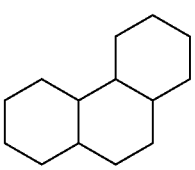

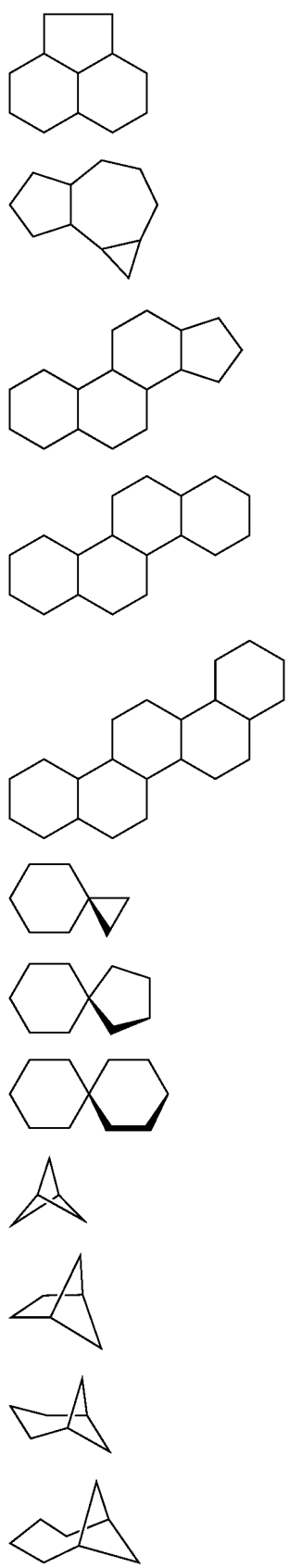

-continued

(35)
(36)
(37)
(38)
(39)
(40)
(41)
(42)
(43)
(44)
(45)
(46)
(47)

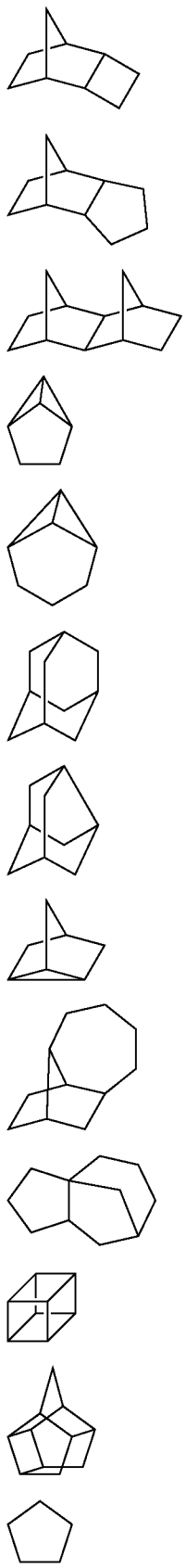

-continued

(48)
(49)
(50)

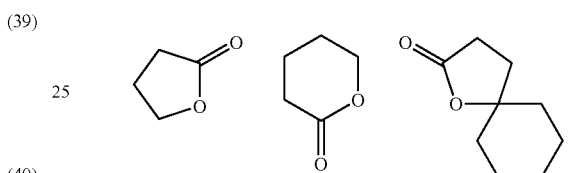

Further, the aliphatic ring structure may contain a —O—C(=O)— structure. Examples of such aliphatic ring are set forth below.

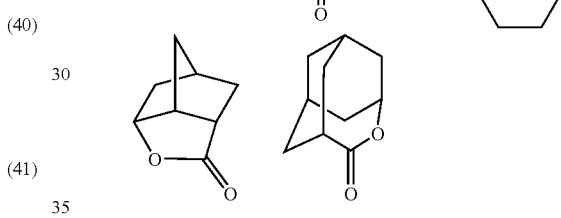

The aliphatic ring may have a substituent, and examples of the substituent include an alkyl group (preferably having from 1 to 10 carbon atoms), a hydroxy group and a polyoxy alkylene group.

The polyoxy alkylene group includes, for example, groups represented by the following foumulae:

—$(C_2H_4O)_p$—$C_qH_{2q+1}$ (wherein p represents an integer of from 1 to 8, and q represents an integer of from 0 to 4)

—$(C_3H_6O)_x$—$C_yH_{2y+1}$ (wherein x represents an integer of from 1 to 4, and y represents an integer of from 0 to 8)

The aromatic ring included in the compound (C1) is preferably an aromatic ring having from 6 to 30 carbon atoms, and includes, for example, benzene, naphthalene and anthracene. A substituent that the aromatic ring may have includes an alkyl group (preferably having from 1 to 10 carbon atoms), a hydroxy group, a carboxy group, a cyano group, a nitro group and a polyoxy alkylene group (for example, the polyoxy alkylene groups described above).

Specific examples of the compound (C1) are set force below, but the invention should not be construed as being limited thereto.

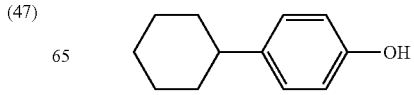

-continued

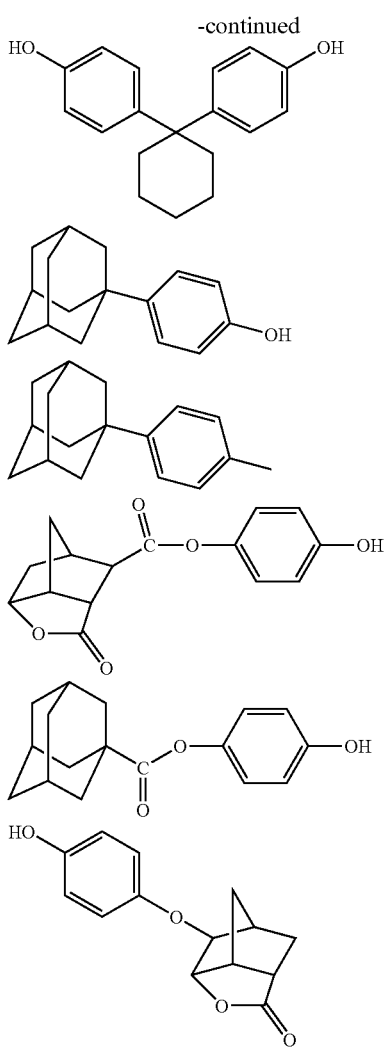

A weight average molecular weight of the compound (C1) is 1,000 or less, preferably from 50 to 850, and more preferably from 100 to 800.

As the compound (C1), a commercially available compound may be used or it may be synthesized according to known methods.

An amount of the compound (C1) added is ordinarily from 0.25 to 20% by weight, and preferably from 0.5 to 10% by weight, based on the total solid content (excluding a solvent) of the photosensitive composition.

[4] Resin Containing a Hydroxystyrene Unit (C2)

The resin containing a hydroxystyrene unit (C2) is a resin containing 20% by mole or more of a hydroxystyrene unit. The unit other than the hydroxystyrene unit is not particularly restricted as long as it can be copolymerized with hydroxystyrene.

From the standpoints of solubility of the exposed area, sensitivity and prevention of the resin from dissolution in the unexposed area, when the resin is contained in the photosensitive layer, a dissolution rate of a film of the resin alone is preferably from 0.0001 to 0.5 nm/second in a 2.38% by weight aqueous solution of tetramethylammonium hydroxide at 23° C.

A weight average molecular weight of the resin (C2) is preferably from 2,000 to 50,000, and more preferably from 5,000 to 30,000. The molecular weight distribution (Mw/Mn) thereof is preferably 3.0 or less, and more preferably 2.0 or less.

Particularly preferred examples of the resin include resins containing a repeating unit represented by formula (a) shown below and at least one repeating unit selected from repeating units represented by formulae (b-1) to (b-3) shown below.

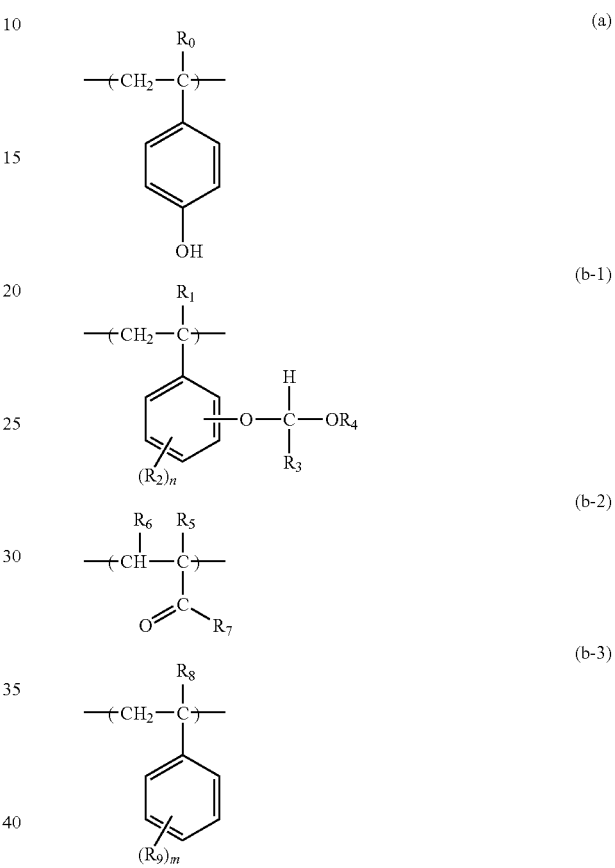

In formula (a), $R_0$ represents a hydrogen atom or a methyl group.

In formula (b-1), $R_1$ represents a hydrogen atom or a methyl group; $R_2$ represents an alkyl group or an alkoxy group; $R_3$ and $R_4$ each independently represents an alkyl group, a halogenated alkyl group, a cycloalkyl group, an aryl group or an aralkyl group, or $R_3$ and $R_4$ may be connected to each other to form a 5-membered to 7-membered ring; and n represents an integer of from 0 to 4.

The alkyl group represented by $R_2$ is preferably an alkyl group having from 1 to 4 carbon atoms and specifically includes, for example, a methyl group, an ethyl group, a n-propyl group, an isopropyl group, a n-butyl group, an isobutyl group, a sec-butyl group and a tert-butyl group.

The alkoxy group represented by $R_2$ is preferably an alkoxy group having from 1 to 4 carbon atoms and specifically includes, for example, a methoxy group, an ethoxy group, a n-propoxy group, an isopropoxy group, a n-butoxy group, an isobutoxy group, a sec-butoxy group and a tert-butoxy group.

The alkyl group represented by any one of $R_3$ and $R_4$ is preferably an alkyl group having from 1 to 10 carbon atoms, for example, a methyl group, an ethyl group, a n-propyl group, an isopropyl group, a n-butyl group, an isobutyl group, a sec-butyl group, a tert-butyl group, a n-pentyl group, a neopentyl group, a n-hexyl group, a n-heptyl group, a n-octyl group, a 2-ethylhexyl group, a n-nonyl group or a n-decyl group. As the alkyl group having a substituent, a halogenated alkyl group is particularly exemplified, and an alkyl group having from 1 to 10 carbon atoms substituted with a halogen atom, for example, a fluorine atom, a chlorine atom or a bromine atom is preferred.

The cycloalkyl group represented by any one of $R_3$ and $R_4$ is preferably a cycloalkyl group having from 3 to 10 carbon atoms, for example, a cyclopropyl group, a cyclobutyl group, a cyclopentyl group, a cyclohexyl group, a cycloheptyl group, a cyclooctyl group, a norbornyl group or an isobornyl group.

The aryl group represented by any one of $R_3$ and $R_4$ is preferably an aryl group having from 6 to 10 carbon atoms, for example, a phenyl group, a tolyl group, a xylyl group, a cumenyl group or a 1-naphthyl group.

The aralkyl group represented by any one of $R_3$ and $R_4$ is preferably an aralkyl group having from 7 to 11 carbon atoms, for example, a benzyl group, an α-methylbenzyl group, a phenethyl group or a naphthylmethyl group.

Specific examples of the 5-membered to 7-membered ring formed by connecting $R_3$ and $R_4$ include a cyclopentane ring, a cyclohexane ring and a cycloheptane ring.

The —OCH($R_3$)O$R_4$ represents an acetal group. Specific examples of the acetal group include a 1-methoxyethoxy group, a 1-ethoxyethoxy group, a 1-n-propoxyethoxy group, a 1-isopropoxyethoxy group, a 1-n-butoxyethoxy group, a 1-isobutoxyethoxy group, a 1-sec-butoxyethoxy group, a 1-tert-butoxyethoxy group, a 1-cyclopentyloxyethoxy group, a 1-cyclohexyloxyethoxy group, a 1-norbornyloxyethoxy group, a 1-bornyloxyethoxy group, a phenyloxyethoxy group, a 1-(1-naphthloxy)ethoxy group, a 1-benzyloxyethoxy group, a 1-phenetyloxyethoxy group, a (cyclohexyl)(methoxy)methoxy group, a (cyclohexyl)(ethoxy)methoxy group, a (cyclohexyl)(n-propoxy)methoxy group, a (cyclohexyl)(isopropoxy)methoxy group, a (cyclohexyl)(phenoxy)methoxy group, a (cyclohexyl)(benzyloxy)methoxy group, a (phenyl)(methoxy)methoxy group, a (phenyl)(ethoxy)methoxy group, a (phenyl)(n-propoxy)methoxy group, a (phenyl)(isopropoxy)methoxy group, a (phenyl)(phenoxy)methoxy group, a (phenyl)(benzyloxy)methoxy group, a (benzyl)(methoxy)methoxy group, a (benzyl)(ethoxy)methoxy group, a (benzyl)(n-propoxy)methoxy group, a (benzyl)(isopropoxy)methoxy group, a (benzyl)(phenoxy)methoxy group, a (benzyl)(benzyloxy)methoxy group, a 2-tetrahydrofuranyloxy group and a 2-tetrahydropyranyloxy group.

In formula (b-2), $R_5$ represents a hydrogen atom or a methyl group; $R_6$ represents a hydrogen atom or —COO$R_8$ (wherein $R_8$ represents a hydrogen atom, an alkyl group, a halogenated alkyl group, a cycloalkyl group, an aryl group, an aralkyl group, a (poly)oxyalkylene group or a substituent capable of being decomposed by an acid having a tert-butyl group); and $R_7$ represents a hydrogen atom, a hydroxy group, a halogen atom, an alkyl group, a halogenated alkyl group, a cycloalkyl group, an aryl group, an aralkyl group, a (poly)oxyalkylene group, an acetal group or a ketal group.

Alternatively, $R_7$ may be an acid decomposable group. The acid decomposable group includes the acid decomposable groups (for example, an acid decomposable group containing an alicyclic group) described with respect to the resin (A).

In formula (b-3), $R_8$ has the same meaning as $R_1$; $R_9$ has the same meaning as $R_2$; and m represents an integer of from 0 to 5.

In the resin (C2), the respective repeating units represented by formulae (b-1), (b-2) and (b-3) may be present individually or in combination of two or more thereof.

An amount of the repeating unit represented by formula (a) in the resin is preferably from 20 to 90% by mole, and more preferably from 20 to 80% by mole, based on the total repeating unit constituting the resin.

The total amount of the repeating units represented by formulae (b-1) to (b-3) in the resin is preferably from 10 to 80% by mole, and more preferably from 20 to 80% by mole, based on the total repeating unit constituting the resin.

The total amount of the repeating unit represented by formula (a) and the repeating units represented by formulae (b-1) to (b-3) in the resin is preferably from 60 to 100% by mole, and more preferably from 70 to 100% by mole, based on the total repeating unit constituting the resin.

Examples of other repeating unit contained in the resin (C2) include the repeating units that the resin (A) can contain.

Specific examples of the structure of the resin (C2) are set forth below, but the invention should not be construed as being limited thereto.

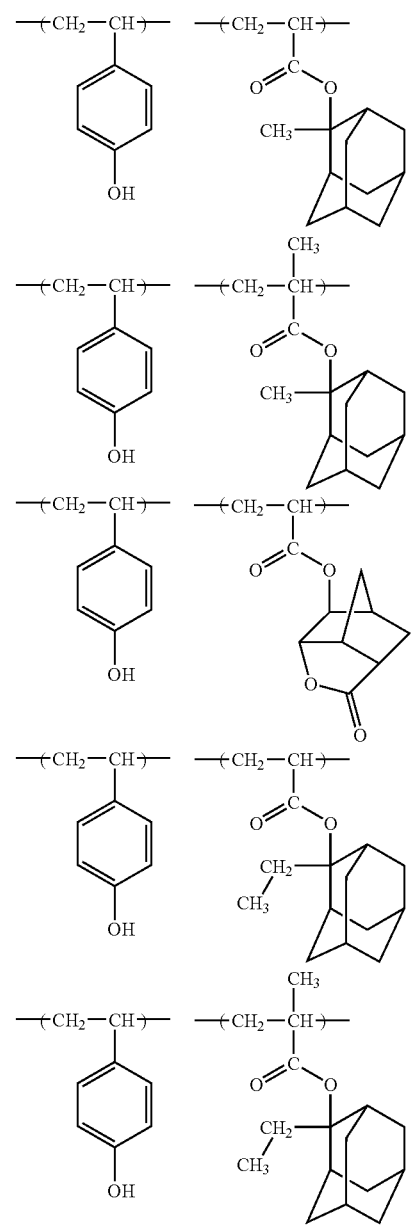

-continued

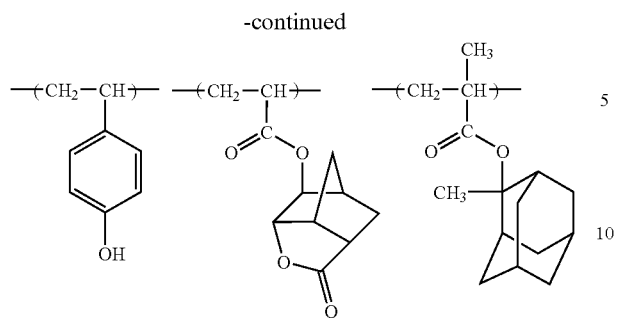
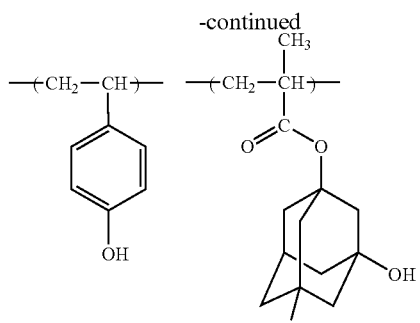

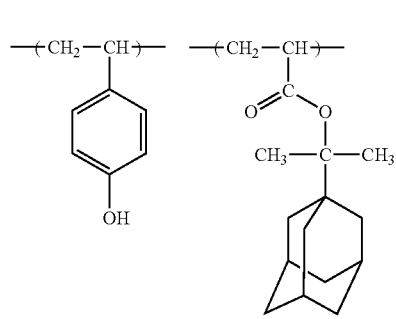
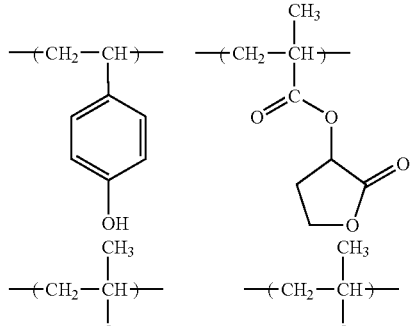

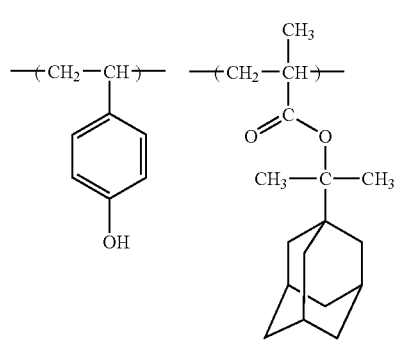
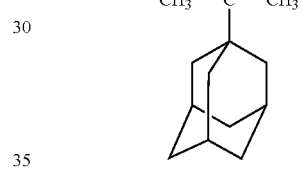

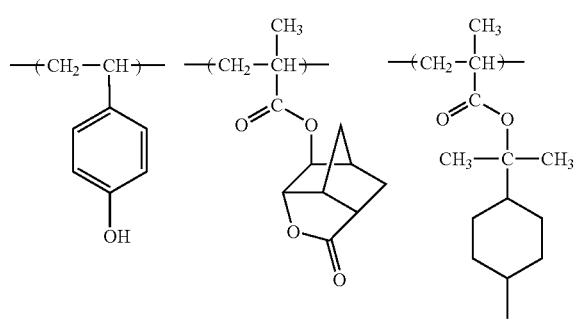

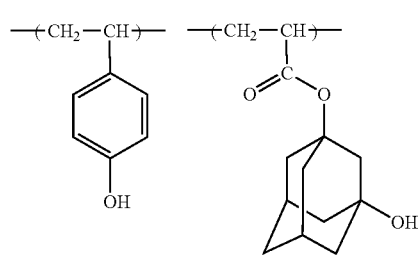

The resin (C2) can be synthesized according to conventional methods, for example, radical polymerization similar to the resin (A).

An amount of the resin (C2) added to the photosensitive composition of the invention is ordinarily from 0.25 to 20% by weight, and preferably from 0.5 to 10% by weight, based on the total solid content of the composition.

[5] Solvent (D Component)

The photosensitive composition of the invention is used by dissolving each of the above-described components in a solvent.

Examples of the solvent include an organic solvent, for example, ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone, tetrahydrofuran, 3-methoxy-1-butanol and propylene carbonate. The solvents may be used individually or as a mixture of two or more thereof.

In the invention, it is particularly preferred that a mixed solvent containing at least two solvents selected from a propylene glycol monoalkyl ether carboxylate, a propylene glycol monoalkyl ether, a chain or cyclic ketone, an alkyl lactate, a cyclic lactone, 3-methoxy-1-butanol and propylene carbonate.

In the specific mixed solvents, each of the specific solvents is preferably included in an amount of 0.5% by weight or more.

The above-described essential components, and if desired, other components described hereinafter are dissolved in the solvent to control the total solid content concentration to ordinarily from 1 to 15% by weight, and preferably from 2 to 10% by weight, thereby preparing the photosensitive composition.

[4] Nitrogen-Containing Basic Compound

It is preferred that the photosensitive composition of the invention further contains a nitrogen-containing basic compound. As the nitrogen-containing basic compound, there are used, for example, an organic amine, a basic ammonium salt and a basic sulfonium salt that do not deteriorate sublimation property and resist performances.

Of the nitrogen-containing basic compounds, organic amines are preferred in the point of providing excellent image characteristics. For example, basic compounds described in JP-A-63-149640, JP-A-5-249662, JP-A-5-127369, JP-A-5-289322, JP-A-5-249683, JP-A-5-289340, JP-A-5-232706, JP-A-5-257282, JP-A-6-242605, JP-A-6-242606, JP-A-6-266100, JP-A-6-266110, JP-A-6-317902, JP-A-7-120929, JP-A-7-146558, JP-A-7-319163, JP-A-7-333844, JP-A-7-219217, JP-A-7-92678, JP-A-7-28247, JP-A-8-22120, JP-A-8-110638, JP-A-8-123030, JP-A-9-274312, JP-A-9-166871, JP-A-9-292708, JP-A-9-325496, JP-T-7-508840 (the term "JP-T" as used herein means a published Japanese translation of a PCT patent application), U.S. Pat. Nos. 5,525,453, 5,629,134 and 5,667,938 are used.

The nitrogen-containing basic compound specifically includes the structure represented by the following formulae (A) to (E).

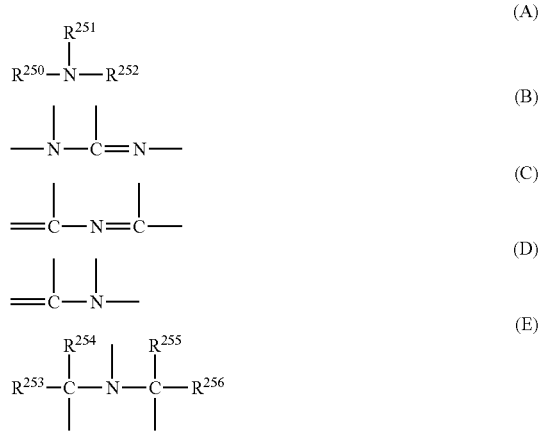

In the above-formulae, $R^{250}$, $R^{251}$ and $R^{252}$, which may be the same or different, each represents a hydrogen atom, an alkyl group having from 1 to 20 carbon atoms, a cycloalkyl group having from 3 to 20 carbon atoms or an aryl group having from 6 to 20 carbon atoms, or $R^{251}$ and $R^{252}$ may be connected to each other to form a ring. Examples of the substituent that these groups may have include an amino group and a hydroxy group.

$R^{253}$, $R^{254}$, $R^{255}$ and $R^{256}$, which may be the same or different, each represents an alkyl group having from 1 to 10 carbon atoms.

A more preferable compound is a nitrogen-containing basic compound having at least two nitrogen atoms of different chemical environments in its molecule or an aliphatic tertiary amine.

Preferred examples of the nitrogen-containing basic compound include 1,5-diazabicyclo[4.3.0]-5-nonene, 1,8-diazabicyclo[5.4.0]-7-undecene, 1,4-diazabicyclo[2.2.2]octane, 4-dimethylaminopyridine, 1-naphthylamine, piperidines, hexamethylenetetramine, imidazoles, hydroxypyridines, pyridines, anilines, hydroxyalkylanilines, 4,4'-diaminodiphenyl ether, pyridinium p-toluenesulfonate, 2,4,6-trimethylpyridinium p-toluenesulfonate, tetramethylammonium p-toluenesulfonate, tetrabutylammonium lactate, triethylamine, tributylamine, tripentylamine, tri-n-octylamine, triisooctylamine, tris(ethylhexyl)amine, tridecylamine and tridodecylamine.

Of the compounds, organic amines, for example, 1,5-diazabicyclo[4.3.0]-5-nonene, 1,8-diazabicyclo[5.4.0]-7-undecene, 1,4-diazabicyclo[2.2.2]octane, 4-dimethylaminopyridine, 1-naphthylamine, piperidine, 4-hydroxypiperidine, 2,2,6,6-tetramethyl-4-hydroxypiperidine, hexamethylenetetramine, imidazoles, hydroxypyridines, pyridines, anilines, particularly 4,4'-diaminodiphenyl ether, triethylamine, tributylamine, tripentylamine, tri-n-octylamine, tris(ethylhexyl) amine, tridodecylamine, N,N-dihydroxyethylaniline, N-hydroxyethyl-N-ethylaniline, triethanolamine, diethanolamine, 2,6-diisopropylaniline and N,N-dibutylaniline are preferred.

A ratio of the acid generator to the nitrogen-containing basic compound used in the photosensitive composition is ordinarily from 1.5 to 300, preferably from 2.0 to 200, and more preferably from 2.5 to 150, in terms of a molar ratio of (acid generator)/(nitrogen-containing basic compound)

[7] Other Additives

The photosensitive composition of the invention may contain, if desired, other additives, for example, a low molecular weight acid-decomposable compound, a surfactant, a dissolution accelerating compound in a developing solution, a halation-preventing agent, a plasticizer, a photosensitizer, an adhesion auxiliary, a crosslinking agent or a photo-base generator.

The photosensitive composition of the invention may contain, if desired, a low molecular weight acid-decomposable compound or a low molecular weight alicyclic compound, which has a molecular weight of 2,000 or less, contains a group capable of being decomposed by the action of an acid and increases alkali solubility by the action of an acid.

For instance, alicyclic compounds having an acid-decomposable group, for example, a cholic acid derivative, a dehydrocholic acid derivative, deoxycholic acid derivative, a lithocholic acid derivative, an ursocholic acid derivative and an abietic acid derivative described in Proc. SPIE, 2724, 355 (1966), JP-A-8-15865, U.S. Pat. Nos. 5,310,619 and 5,372, 912, J. Photopolym. Sci., Tech., Vol. 10, No. 3, 511(1997) and aromatic compounds, for example, a naphthalene derivative having an acid-decomposable group may be used as the low molecular weight acid-decomposable compound.

Further, low molecular weight acid-decomposable dissolution inhibiting compounds described in JP-A-6-51519 can be used in a range of amount that does not deteriorate transmittance at 220 nm, and 1,2-naphthoquinonediazide compounds may also be used.

As an alicyclic moiety of the low molecular weight alicyclic compound, the alicyclic structures of (1) to (50) illustrated for the alicyclic hydrocarbon group in the repeating unit having a partial structure containing the alicyclic hydrocarbon represented by any one of formulae (pI) to (pVI)

described hereinbefore are exemplified. The alicyclic moiety may have a substituent, and examples of the substituent include an alkyl group (preferably having from 1 to 10 carbon atoms), a halogen atom, a hydroxy group, a carboxy group and an alkoxy group.

In the case of using the low molecular weight acid-decomposable dissolution inhibiting compound in the photosensitive composition of the invention, the content thereof is ordinarily from 0.5 to 50 parts by weight, preferably from 0.5 to 40 parts by weight, more preferably from 0.5 to 30 parts by weight, and particularly preferably from 0.5 to 20.0 parts by weight, based on 100 parts by weight of the photosensitive composition (solid content).

Addition of the low molecular weight acid-decomposable dissolution inhibiting compound or the low molecular weight alicyclic compound serves not only for further improvement in development defect but also improvement in dry etching resistance.

Examples of the dissolution accelerating compound in a developing solution for use in the invention include low molecular weight compounds having a molecular weight of 1,000 or less, for example, compounds having two or more phenolic hydroxy groups described in JP-A-3-206458, naphthols, for example, 1-naphthol, compounds having one or more carboxy groups, carboxylic acid anhydrides, sulfonamide compounds and sulfonylimide compounds.

The amount of the dissolution accelerating compound in a developing solution is preferably 30% by weight or less, and more preferably 20% by weight or less, based on the total amount of the photosensitive composition (solid content).

Preferred examples of the halation-preventing agent include compounds capable of efficiently absorbing radiation irradiated, for example, substituted benzenes, for example, fluorene and benzophenone; and polycyclic aromatic compounds, for example, anthracene, anthracene-9-methanol, anthracene-9-carboxyethyl, phenanthrene, perylene and azirene. Of the compounds, the polycyclic aromatic compounds are particularly preferred. The halation-preventing agent functions to decrease reflected light from a substrate and to reduce influence of multi-reflection in the photosensitive layer, and thus exhibiting the effect of decreasing the affection of standing wave.

Also, in order to improve acid-generating efficiency due to exposure, a photosensitizer may be added to the photosensitive composition. Preferred examples of the photosensitizer include benzophenone, p,p'-tetramethyldiaminobenzophenone, 2-chlorothioxanthone, anthrone, 9-ethoxyanthracene, pyrene, phenothiazine, benzyl, benzoflavin, acetophenone, phenanthrene, benzoquinone, anthraquinone and 1,2-naphthoquinone, but the invention should not be construed as being limited thereto. The photosensitizer may also be used as the halation-preventing agent.

It is preferred that the photosensitive composition of the invention contains a surfactant, particularly, any one or two or more of fluorine-base and/or silicon-base surfactants (a fluorine atom-containing surfactant, a silicon atom-containing surfactant and a surfactant containing both a fluorine atom and a silicon atom).

By the incorporation of the fluorine-base and/or silicon-base surfactant into the photosensitive composition of the invention, the photosensitive composition can provide, at high sensitivity and good resolution, patterns having good adhesion and less development defect, when an exposure light source of 250 nm or less, especially 220 nm or less is used.

Examples of the surfactant include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. Commercially available surfactants described below may also be used as they are.

Examples of the commercially available surfactant used include fluorine-base surfactants and silicon-base surfactants, for example, Eftop EF301 and EF303 (manufactured by Shin-Akita Kasei Co., Ltd.), Florad FC430 and FC431 (manufactured by Sumitomo 3M Ltd.), Megafac F171, F173, F176, F189 and R08 (manufactured by Dainippon Ink and Chemicals, Inc.), Surflon S-382, SC101, 102, 103, 104, 105 and 106 (manufactured by Asahi Glass Co., Ltd.) and Troysol S-366 (manufactured by Troy Chemical Corp.). A polysiloxane polymer KP-341 (manufactured by Shin-Etsu Chemical Co., Ltd.) is also used as a silicon-base surfactant.

As the surfactant, there may be used surfactants using a polymer having a fluoroaliphatic group derived from a fluoroaliphatic compound produced by a teromerization process (also called a teromer process) or an oliogomerization process (also called an oligmer process). The fluoroaliphatic compound can be synthesized according to the method described in JP-A-2002-90991.

As the polymer having a fluoroaliphatic group, copolymers between a monomer having a fluoroaliphatic group and (poly (oxyalkylene)) acrylate and/or (poly(oxyalkylene)) methacrylate are preferred. The comonomers may be distributed at random or may be block-copolymerized. Examples of the poly(oxyalkylene) group include a poly(oxyethylene) group, a poly(oxypropylene) group and a poly(oxybutylene) group. Also, the poly(oxyalkylene) group may be a unit having alkylene moieties different in chain length in the same chain, for example, poly(oxyethylene/oxypropylene/oxyethylene block linkage) or poly(oxyethylene/oxypropylene block linkage). Further, in addition to the copolymer between the monomer having a fluoroaliphatic group and (poly(oxyalkylene)) acrylate (or methacrylate), a copolymer of three or more comonomers obtained, for example, by copolymerizing two or more fluoroaliphatic group-having monomers different in the fluoroaliphatic group and two or more (poly(oxyalkylene)) acrylates (or methacrylates) may be used as well.

Examples of the commercially available surfactant include Megafac F178, F-470, F-473, F-475, F-476 and F-472 (manufactured by Dainippon Ink and Chemicals, Inc.). Further, there may be illustrated a copolymer between an acrylate (or methacrylate) having a $C_6F_{13}$ group and (poly(oxyalkylene)) acrylate (or methacrylate), a copolymer between an acrylate (or methacrylate) having a $C_6F_{13}$ group, (poly(oxyethylene)) acrylate (or methacrylate) and (poly(oxypropylene)) acrylate (or methacrylate), a copolymer between an acrylate (or methacrylate) having a $C_8F_{17}$ group and (poly(oxyalkylene)) acrylate (or methacrylate), and a copolymer between an acrylate (or methacrylate) having a $C_8F_{17}$ group, (poly(oxyethylene)) acrylate (or methacrylate) and (poly(oxypropylene)) acrylate (or methacrylate).

An amount of surfactant used is preferably from 0.0001 to 2% by weight, and more preferably from 0.001 to 1% by weight, based on the total amount of the photosensitive composition (excluding a solvent).

[8] Pattern Forming Method

The photosensitive composition of the invention is used by dissolving the above-described components in a solvent, preferably in the mixed solvent described above and coating on a desired substrate in the following manner.

Specifically, the photosensitive composition is coated on a substrate (for example, silicon/silicon dioxide coating) as used for the production of a precise integrated circuit device by an appropriate coating method, for example, spinner or coater, and dried to form a photosensitive layer.

The photosensitive layer is exposed with an active ray or radiation through a desired mask, preferably baked and then developed. Thus, good positive patterns can be obtained. As the active ray or radiation for the exposure, a far ultraviolet ray having preferably a wavelength of 200 nm or shorter is used. Specific examples thereof include an ArF excimer laser (193 nm), an $F_2$ excimer laser (157 nm), an electron beam, an X-ray and an ion beam. The ArF excimer laser and $F_2$ excimer laser are preferred.

The photosensitive composition of the invention exhibits excellent performances, even when it forms a thin layer having a dry thickness of 250 nm or less. For instance, a photosensitive layer of the photosensitive composition having a dry thickness of 250 nm or less (preferably from 50 to 250 nm) is formed on a substrate, and the photosensitive layer is exposed with an active ray or radiation having a wavelength of 200 nm or shorter (preferably an ArF excimer laser or an $F_2$ excimer laser), subjected to heat treatment at a temperature of 150° C. or less (preferably from 80 to 150° C.), and developed with an alkali developing solution, thereby obtaining favorable results.

As the alkali developing solution for use in the development, an aqueous alkaline solution containing, for example, an inorganic alkali, e.g., sodium hydroxide, potassium hydroxide, sodium carbonate, sodium silicate, sodium metasilicate or aqueous ammonia, a primary amine, e.g., ethylamine or n-propylamine, a secondary amine, e.g., diethylamine or di-n-butylamine, a tertiary amine, e.g., triethylamine or methyldiethylamine, an alcohol amine, e.g., dimethylethanolamine or triethanolamine, a quaternary ammonium salt, e.g., tetramethylammonium hydroxide or tetraethylammonium hydroxide, and a cyclic amine, e.g., pyrrole or piperidine can be used.

The alkali concentration of the alkali developing solution is ordinarily from 0.1 to 20% by weight, and the pH thereof is ordinarily from 10.0 to 15.0.

A developing solution prepared by adding an appropriate amount of an alcohol or a surfactant to the above-described aqueous alkaline solution may also be used.

The present invention is described in more detail with reference to the following examples, but the invention should not be construed as being limited thereto. In the synthesis examples described below, a ratio of solvent in the case of using a plurality of the solvents is indicated by a weight ratio, and a monomer ratio and a polymer composition ratio are indicated by a molar ratio.

[Synthesis of Resin (A1)]

Norbornane lactone acrylate, dihydroxyadamantane methacrylate, 2-adamantyl-2-propyl methacrylate and methacrylic acid in a ratio of 40/20/30/10 were dissolved in a mixed solvent of propylene glycol monomethyl ether acetate and propylene glycol monomethyl ether (60/40) to prepare 450 g of a solution having a solid content concentration of 22%. To the solution was added 8% by mole of a polymerization initiator (V-601, manufactured by Wako Pure Chemical Industries, Ltd.), and the solution was added dropwise to 50 g of a mixed solvent of propylene glycol monomethyl ether acetate and propylene glycol monomethyl ether (60/40) heated at 100° C. under nitrogen atmosphere over a period of 6 hours. After the completion of the dropwise addition, the reaction solution was stirred for 2 hours. After the termination of the reaction, the reaction solution was cooled to room temperature and poured into 5 liters of a mixed solution of hexane and ethyl acetate (9/1) to crystallize, and the white powder deposited was collected by filtration to recover the desired Resin (A1). A composition ratio of a/b/c/d of the resin determined by $C^{13}$NMR was 39/22/30/9. The weight average molecular weight thereof measured by gas permeation chromatography (GPC) and calculated in terms of standard polystyrene was 7,800 and the molecular weight distribution thereof was 2.0.

[Synthesis of Resin (A2)]

The desired Resin (A2) was obtained by the polymerization method in the same manner as in the synthesis of Resin (A1) using the respective monomers. A composition ratio of a/b/c of the resin determined by $C^{13}$NMR was 38/22/40. The weight average molecular weight thereof measured by GPC and calculated in terms of standard polystyrene was 8,900 and a molecular weight distribution thereof was 2.1.

[Synthesis of Resin (A3)]

The desired Resin (A3) was obtained by the polymerization method in the same manner as in the synthesis of Resin (A1) using the respective monomers. A composition ratio of a/b/c/d of the resin determined by $C^{13}$NMR was 34/13/23/30. The weight average molecular weight thereof measured by GPC and calculated in terms of standard polystyrene was 7,500 and a molecular weight distribution thereof was 2.3.

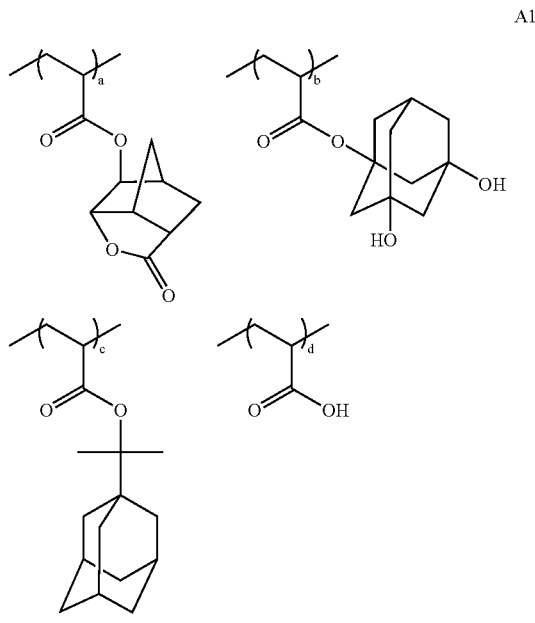

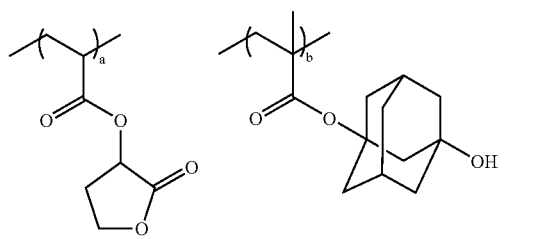

-continued

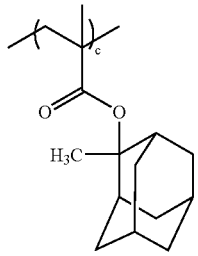
A3

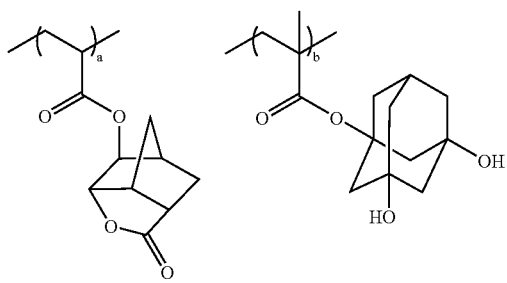

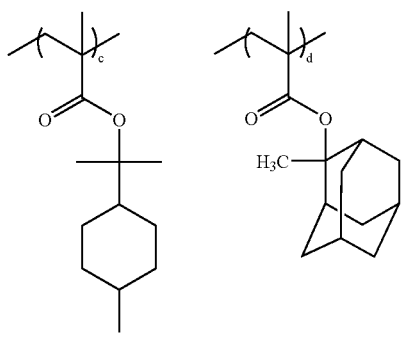

Compounds (C1-1) to (C1-4), which are compounds having a molecular weight of 1,000 or less and containing an aliphatic structure and an aromatic ring in its molecule used in the examples described hereinafter, are shown below.

C1-1

C1-2

C1-3

-continued

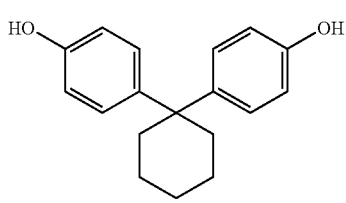
C1-4

The resins (C2) containing a hydroxystyrene unit used in the examples described hereinafter were synthesized in the following manner.

[Synthesis of Resin (C2-1)]

In 80 ml of tetrahydrofuran was dissolved 20 g of poly(p-hydroxystyrene) (VP-8000, manufactured by Nippon Soda Co., Ltd.). To the solution were added 7.8 g of ethyl vinyl ether and 10 m g of p-toluenesulfonic acid as a catalyst, followed by stirring at room temperature for 18 hours. The reaction solution was added dropwise to 5 liters of ultrapure water with vigorous stirring to conduct recrystallization. The resin thus obtained was dried at 70° C. for 12 hours in a vacuum dryer to recover the desired Resin (C2-1). A composition ratio of a/b of the resin was 60/40.

[Synthesis of Resin (C2-2)]

The desired Resin (C2-2) was obtained by the polymerization method in the same manner as in the synthesis of Resin (A1) using the respective monomers. A composition ratio of a/b of the resin determined by $C^{13}NMR$ was 75/25. The weight average molecular weight thereof measured by GPC method and calculated in terms of standard polystyrene was 11,000 and a molecular weight distribution thereof was 2.1.

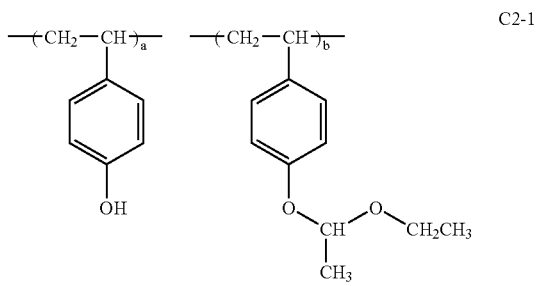
C2-1

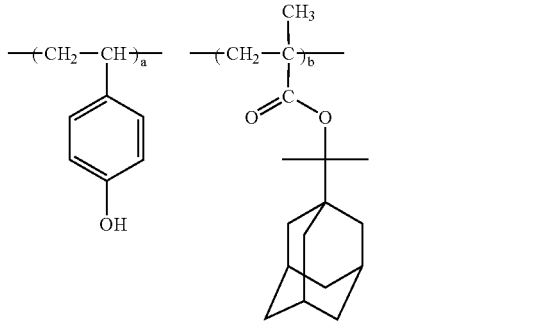
C2-2

[Evaluation of Performances]

The components of each of Examples 1 to 7 and Comparative Examples 1 to 4 shown in Table 1 below were mixed and the resulting solution was filtered through a polyethylene filter having a pore size of 0.1 μm to prepare a solution of photosensitive resin composition. Using the solution, the evaluations of performances were conducted according to the methods described below. The results obtained are shown in Table 1 below.

Q2: 2,6-Diisopropylaniline
Q3: Triethanolamine
PGMEA: Propylene glycol monomethyl ether acetate
PGME: Propylene glycol monomethyl ether

TABLE 1 (A)

| | Ingredient | | | | | Condition Pre-Bake Temperature/ PEB Temperature (° C.) |
|---|---|---|---|---|---|---|
| | Resin (part by weight) | Photo-Acid Generator (part by weight) | Additive (part by weight) | Nitrogen-Containing Basic Compound (part by weight) | Solvent (part by weight) | |
| Example 1 | A1 (94.0) | B1 (4.0) | C1-1 (2.0) | Q1 (0.40) | PGMEA/PGME/PC (525/225/7) | 115/115 |
| Example 2 | A1 (94.0) | B1 (2.0) B2 (1.5) | C1-4 (2.0) | Q2 (0.35) | PGMEA/PGME/PC (525/225/7) | 115/115 |
| Example 3 | A1 (94.0) | B1 (4.0) | C2-1 (2.0) | Q3 (0.30) | PGMEA/CH (450/300) | 115/115 |
| Example 4 | A1 (94.0) | B1 (2.0) B3 (2.0) | C1-2 (1.0) C1-3 (1.0) | Q1 (0.40) | PGMEA/PGME/AE (530/210/15) | 115/115 |
| Example 5 | A1 (94.0) | B1 (3.5) | C1-1 (1.0) C2-2 (1.0) | Q2 (0.40) | PGMEA/PGME/PC (525/225/7) | 115/115 |
| Example 6 | A1 (47.0) A3 (47.0) | B1 (4.5) | C1-3 (2.0) | Q3 (0.50) | PGMEA/PGME/PC (525/225/7) | 115/115 |
| Example 7 | A2 (94.0) | B1 (1.5) B2 (1.5) B3 (1.0) | C2-1 (1.0) C2-2 (1.0) | Q2 (0.45) | PGMEA/PGME/PC (525/225/7) | 130/130 |
| Comparative Example 1 | A-1 (100) | B-1 (5) | C-1 (1.0) | D-1 (0.45) | E-1 (450) E-2 (200) | 130/110 |
| Comparative Example 2 | A-1 (100) | B-1 (5) | C-2 (1.0) | D-1 (0.45) | E-1 (450) E-2 (200) | 130/110 |
| Comparative Example 3 | A-1 (100) | B-1 (5) | C-3 (2.0) | D-1 (0.45) | E-1 (450) E-2 (200) | 130/110 |
| Comparative Example 4 | A1 (94.0) | B1 (4.0) | — | Q1 (0.40) | PGMEA/PGME/PC (525/225/7) | 115/115 |

TABLE 1 (B)

| | Evaluation | | | | | | |
|---|---|---|---|---|---|---|---|
| | Sensitivity (mJ/cm$^2$) | Resolution (μm) | Pattern Profile | Pattern Collapse Latitude (%) | LER (nm) | Exposure Latitude (%) | Focus Latitude (μm) |
| Example 1 | 31.3 | 75 | Good | 32.3 | 8.5 | 13.8 | 1.0 |
| Example 2 | 32.3 | 70 | Good | 25.0 | 8.3 | 14.9 | 0.9 |
| Example 3 | 37.9 | 70 | Good | 21.6 | 8.0 | 14.8 | 0.7 |
| Example 4 | 29.0 | 75 | Good | 32.0 | 8.5 | 13.9 | 1.0 |
| Example 5 | 33.0 | 75 | Good | 27.0 | 8.6 | 13.8 | 0.9 |
| Example 6 | 30.0 | 75 | Good | 30.0 | 8.2 | 14.1 | 1.0 |
| Example 7 | 35.0 | 75 | Good | 21.0 | 8.6 | 14.7 | 0.7 |
| Comparative Example 1 | 25.0 | 75 | Bad | 18.0 | 9.4 | 12.0 | 0.5 |
| Comparative Example 2 | 24.5 | 75 | Bad | 17.5 | 9.8 | 12.5 | 0.6 |
| Comparative Example 3 | 23.0 | 75 | Bad | 18.5 | 9.5 | 12.8 | 0.6 |
| Comparative Example 4 | 38.6 | 75 | Bad | 18.5 | 9.2 | 14.5 | 0.6 |

Respective ingredients shown in Table 1 are as follows.

B1: Triphenylsulfonium nonaflate
B2: 4-Methylphenyldiphenylsulfonium 4-dodecanyloxytetrafluorobenzenesulfonate
B3: Di-n-butyl[2-(4-cyclohexylphenyl)-2-oxoethyl]sulfonium nonaflate
Q1: 2-[(2-Hydroxyethyl)phenylamino]ethanol PC: Propylene carbonate
CH: Cyclohexanone
AE: Ethyl acetate The ingredients used in Comparative Examples 1 to 3 include those as shown below and the ingredients used in the examples of JP-A-2003-322963.

A-i: 2-Methyl-2-adamantyl methacrylate unit/5-(2,6-norbornanecarbolactone) methacrylate unit (molar ratio: 50/50)
B-1: 1-(4-n-Butoxynaphthalene-1-yl)tetrahydrothiophenium nonafluoro-n-butanesulfonate

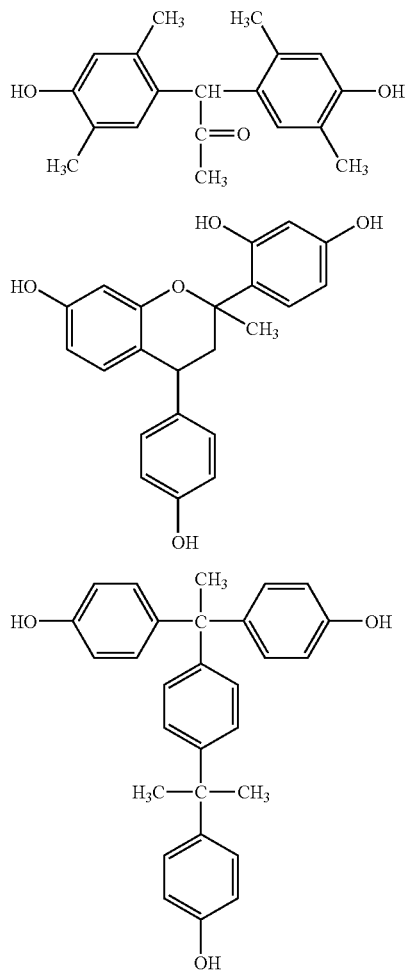

D-1: N-tert-Butoxycarbonyl-2-phenylbenzimidazole
E-1: Propylene glycol monomethyl ether acetate
E-2: 2-Heptanone

[Sensitivity]

A silicon wafer having an antireflective coating (ARC29A) having a thickness of 78 nm formed thereon was used as a substrate. Each photosensitive composition was coated on the substrate by spin coat, and subjected to pre-bake (PB) at a pre-bake temperature shown in Table 1 for 60 seconds on a hot plate to prepare a photosensitive layer having a thickness of 140 nm. The photosensitive layer was exposed using an ArF excimer laser exposure apparatus (manufactured by ASML; lens numerical aperture: 0.75; dipole illumination) through a mask pattern of 6% half-tone mask. Then, the exposed photosensitive layer was subjected to PEB at a PEB temperature shown in Table 1 for 60 seconds and developed with a 2.38% by weight aqueous tetramethylammonium hydroxide solution at 23° C. for 30 seconds. After the development, it was rinsed and dried to form a positive pattern. An exposure amount necessary for forming a line and space pattern (line:space=1:1) of 75 nm as a resist pattern having a line width of 1:1 was regarded as an optimum exposure amount (Eopt), and the optimum exposure amount was used for the evaluation of sensitivity (mJ/cm$^2$)

[Resolution]

A dimension of a minimum pattern resolved in the above-described optimum exposure amount was used for the evaluation of resolution (μm).

[Pattern Profile]

In the rectangular cross-section of the line and space pattern (line:space=1:1) of 75 nm in a line width, dimensions of a lower side (L1) and an upper side (L2) were measured by a scanning electron microscope. The case where L1 and L2 of the pattern satisfied a formula of $0.85 \leqq L2/L1 \leqq 1$ and it does not have a tapered-shape is evaluated that the pattern profile was good.

[Pattern Collapse Latitude]

A line and space pattern (line:space=1:1) of 75 nm in a line width was prepared in the best focus position, and while increasing the exposure amount, an exposure amount at which pattern collapse was initiated was defined as EC. A value of EC/Eopt×100 was used as a scale of the pattern collapse latitude (%). The larger the value, the better the pattern collapse latitude is.

[Line Edge Roughness]

A line and space pattern (line:space=1:1) of 75 nm in a line width was prepared in the best focus position and at Eopt. The width of the line pattern was measured from above in 32 points at intervals of 10 nm, a standard deviation was determined, and 3σ (nm) thereof was used as a scale of the line edge roughness (LER). The smaller the value, the better the line edge roughness is.

[Exposure Latitude]

A line and space pattern (line:space=1:1) of 75 nm in a line width was prepared in the best focus position, and while changing the exposure amount, an exposure amount at which the dimension of line width was plus 10% was defined as EO and an exposure amount at which the dimension of line width was minus 10% was defined as EU. A value of (EO−EU)/Eopt×100 was used as a scale of the exposure latitude (%). The larger the value, the better the exposure latitude is.

[Focus Latitude]

A line and space pattern (line:space=1:1) of 75 nm in a line width was prepared in the optimum exposure amount, and when the focus position was moved, a focus range (μm) that provided variation in the dimension of line width within plus/minus 10% was used as a scale of the focus latitude. The larger the value, the better the focus latitude is.

From the results shown in Table 1, it can be seen that the photosensitive composition of the invention is excellent in the above-described various performances.

The entire disclosure of each and every foreign patent application from which the benefit of foreign priority has been claimed in the present application is incorporated herein by reference, as if fully set forth herein.

While the invention has been described in detail and with reference to specific embodiments thereof, it will be apparent to one skilled in the art that various changes and modifications can be made therein without departing from the spirit and scope thereof.

What is claimed is:

1. A photoresist composition comprising (A) a resin that is decomposed by the action of an acid to increase solubility in an alkali developing solution, (B) a compound that generates an acid upon irradiation of an actinic ray or radiation, and (C1) a nonionic compound having a molecular weight of 1,000 or less and containing an aliphatic ring and a phenol ring, wherein the resin (A) comprises a repeating unit having a group represented by the following formula (I) and a repeating unit which has a group represented by at least one of the following formulae (V-I) to (V-4) or which is represented by the following formula (IV):

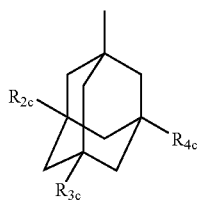
(I)

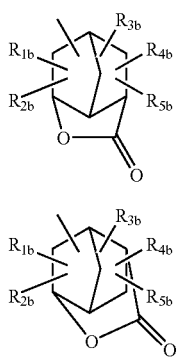
(V-1)
(V-2)
(V-3)

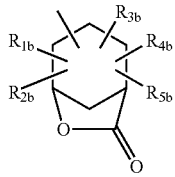
(V-4)

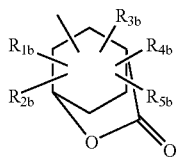

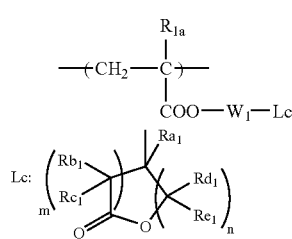
(IV)

wherein $R_2$ to $R_4$ each independently represents a hydrogen atom or a hydroxy group, provided that at least one of $R_2$ to $R_1$ represents a hydroxy group, $R_{1b}$ to $R_{5b}$ each independently represents a hydrogen atom, an alkyl group, a cycloalkyl group, or an alkenyl group, or two of $R_{1b}$ to $R_{5b}$ may be connected to each other to form a ring, $R_{1a}$ represents a hydrogen atom or a methyl group, $W_1$ represents an individual group or a combination of two or more groups, selected from a single bond, an alkylene group, an ether group, a thioether group, a carbonyl group and an ester group, $R_{a1}$, $R_{b1}$, $R_{c1}$, $R_{d1}$ and $R_{e1}$ each independently represents a hydrogen atom or an alkyl group having from 1 to 4 carbon atoms, and m and n each independently represents an integer of from 0 to 3, provided that m+n is from 2 to 6, and wherein the photoresist composition is suitable for exposure with an ArF excimer laser.

2. A photoresist composition comprising (A) a resin that is decomposed by the action of an acid to increase solubility in an alkali developing solution, (B) a compound that generates an acid upon irradiation of an actinic ray or radiation, and (C2) a resin containing a hydroxystyrene unit, wherein the resin (A) contains a repeating unit including an alicyclic group that is decomposed by the action of an acid to increase solubility in an alkali developing solution, the alicyclic group having 7 to 25 carbon atoms, a repeating unit having a group represented by the following formula (I):

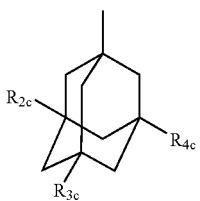
(I)

wherein $R_{2c}$ to $R_{4c}$ each independently represents a hydrogen atom or a hydroxy group, provided that at least one of $R_{2c}$ to $R_{4c}$ represents a hydroxy group, and a repeating unit which has a group represented by at least one of the following formulae (V-I) to (V-4) or which is represented by the following formula (IV):

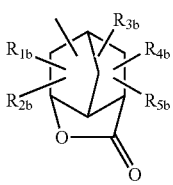
(V-1)

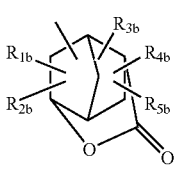
(V-2)

-continued

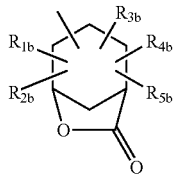
(V-3)

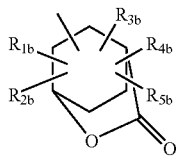
(V-4)

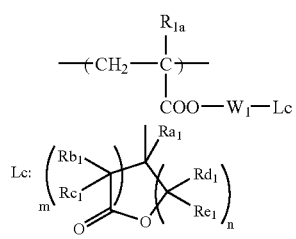
(IV)

wherein $R_{1b}$ to $R_{5b}$ each independently represents a hydrogen atom, an alkyl group, a cycloalkyl group, or an alkenyl group, or two of $R_{1b}$ to $R_{5b}$ may be connected to each other to form a ring, $R_{1a}$ represents a hydrogen atom or a methyl group, $W_1$ represents an individual group or a combination of two or more groups selected from a single bond, an alkylene group, an ether group, a thioether group, a carbonyl group and an ester group, $R_{a1}$, $R_{b1}$, $R_{c1}$, $R_{d1}$ and $R_{e1}$ each independently represents a hydrogen atom or an alkyl group having from 1 to 4 carbon atoms, and m and n each independently represents an integer of from 0 to 3, provided that m+n is from 2 to 6, and wherein the photoresist composition is suitable for exposure with an ArF excimer laser.

3. The photoresist composition as claimed in claim 2, wherein the resin (C2) has a molecular weight distribution of 2.0 or less.

4. The photoresist composition as claimed in claim 2, wherein the resin (C2) is a resin wherein a part of hydroxy groups of polyhydroxystyrene are protected with a group decomposable by a reaction with an acid.

5. The photoresist composition as claimed in claims 2, wherein the resin (C2) is a copolymer containing at least a hydroxystyrene unit and a unit wherein a carboxy group in methacrylic acid or acrylic acid is protected with an alicyclic group decomposable by an acid.

6. A positive pattern forming method comprising forming a photosensitive layer having a dry layer thickness of 250 nm or less comprising the photoresist composition as claimed in claim 1 on a substrate, exposing the photosensitive layer to an actinic ray or radiation having a wavelength of 200 nm or shorter, subjecting the exposed photosensitive layer to heat treatment at 150° C. or lower, and then developing the heat-treated photosensitive layer with an alkali developing solution.

7. A positive pattern forming method comprising forming a photosensitive layer having a dry layer thickness of 250 nm or less comprising the photoresist composition as claimed in claim 2 on a substrate, exposing the photosensitive layer to an actinic ray or radiation having a wavelength of 200 nm or shorter, subjecting the exposed photosensitive layer to heat treatment at 150° C. or lower, and then developing the heat-treated photosensitive layer with an alkali developing solution.

8. The photoresist composition as claimed in claim 1, wherein the resin (A) contains a repeating unit including an alicyclic group that is decomposed by the action of an acid to increase solubility in an alkali developing solution, the alicyclic group having 7 to 25 carbon atoms.

9. The photoresist composition as claimed in claim 1, wherein the resin (A) comprises a repeating unit having a group represented by the following formula (AII):

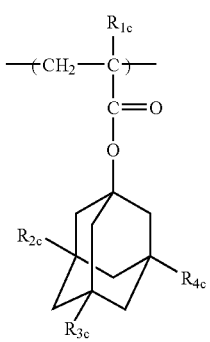
(AII)

wherein $R_{1c}$ represents a hydrogen atom or a methyl group, and $R_{2c}$ to $R_{4c}$ each independently represents a hydrogen atom or a hydroxy group, provided that at least one of $R_{2c}$ to $R_{4c}$ represents a hydroxy group.

10. The photoresist composition as claimed in claim 2, wherein the resin (A) comprises a repeating unit having a group represented by the following formula (AII):

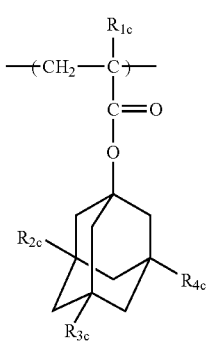
(AII)

wherein $R_{1c}$ represents a hydrogen atom or a methyl group, and $R_{2c}$ to $R_{4c}$ each independently represents a hydrogen atom or a hydroxy group, provided that at least one of $R_{2c}$ to $R_{4c}$ represents a hydroxy group.

* * * * *